(12) United States Patent
Ohsawa et al.

(10) Patent No.: US 9,740,255 B2
(45) Date of Patent: Aug. 22, 2017

(54) MEMORY CELL AND STORAGE DEVICE

(71) Applicant: TOHOKU UNIVERSITY, Sendai-shi (JP)

(72) Inventors: Takashi Ohsawa, Sendai (JP); Tetsuo Endoh, Sendai (JP)

(73) Assignee: Tohoku University, Sendai-shi (JP)

( * ) Notice: Subject to any disclaimer, the term of this patent is extended or adjusted under 35 U.S.C. 154(b) by 0 days.

(21) Appl. No.: 15/023,066

(22) PCT Filed: Sep. 18, 2014

(86) PCT No.: PCT/JP2014/074741
§ 371 (c)(1),
(2) Date: Mar. 18, 2016

(87) PCT Pub. No.: WO2015/041305
PCT Pub. Date: Mar. 26, 2015

(65) Prior Publication Data
US 2016/0224082 A1     Aug. 4, 2016

(30) Foreign Application Priority Data
Sep. 20, 2013 (JP) ................................. 2013-196203

(51) Int. Cl.
*G06F 1/26* (2006.01)
*G11C 14/00* (2006.01)
*G11C 11/16* (2006.01)

(52) U.S. Cl.
CPC .............. *G06F 1/26* (2013.01); *G11C 11/161* (2013.01); *G11C 11/1697* (2013.01); *G11C 14/0081* (2013.01)

(58) Field of Classification Search
USPC .................................................. 365/148, 154
See application file for complete search history.

(56) References Cited

U.S. PATENT DOCUMENTS 6,215,685 B1 * 4/2001 Fung ...................... G11C 15/00
365/189.011
6,994,050 B2 * 2/2006 Johnson ................ B63B 25/002
114/343

(Continued)

FOREIGN PATENT DOCUMENTS

JP      2004-213860      7/2004
JP      2013-30240       2/2013

(Continued)

OTHER PUBLICATIONS

Int'l. Search Report issued in Int'l. App. No. PCT/JP2014/074741, dated Oct. 28, 2014.

(Continued)

*Primary Examiner* — Huan Hoang
*Assistant Examiner* — Minh Dinh
(74) *Attorney, Agent, or Firm* — Greer Burns & Crain Ltd.

(57) ABSTRACT

A memory cell (101) is connected to a word line (WL), a bit line (BL), and a power supply line (PL), and includes a flip-flop storing data based on a change in resistance value of a magnetic tunnel junction element, and, a power gating field-effect transistor including a drain that is one end of a current path connected to the power supply line, and which has another end connected to the flip-flop. The ON and OFF states of the power gating field-effect transistor are controlled based on a control signal applied to a control terminal of the power gating field-effect transistor.

21 Claims, 37 Drawing Sheets

(56) References Cited

U.S. PATENT DOCUMENTS

| | | | |
|---|---|---|---|
| 8,023,299 B1* | 9/2011 | Gharia | G11C 11/16 365/49.1 |
| 2004/0125643 A1 | 7/2004 | Kang et al. | |
| 2015/0070971 A1* | 3/2015 | Katayama | G11C 13/004 365/148 |
| 2015/0332745 A1* | 11/2015 | Ohsawa | G11C 14/0081 365/148 |

FOREIGN PATENT DOCUMENTS

| WO | WO 2009/028298 A1 | 3/2009 |
|---|---|---|
| WO | WO 2009/031231 A1 | 3/2009 |

OTHER PUBLICATIONS

Ohsawa et al; "Strategy of STT-MRAM Cell Design and Its Power Gating Technique for Low-Voltage and Low-Power Cache Memories"; IEEE Journal of Solid-State Circuits, vol. 48, No. 6, p. 1511; 2013.

\* cited by examiner

MEMORY CELL AND STORAGE DEVICE

This is a National Phase Application filed under 35 U.S.C. §371, of International Application No. PCT/JP2014/074741, filed Sep. 18, 2014.

TECHNICAL FIELD

The present disclosure relates to a memory cell and a storage device.

BACKGROUND ART

Spin Transfer Torque-Magnetoresistive Random Access Memories (SST-MRAM) that are memories utilizing a Magnetic Tunnel Junction (MTJ) element that is a resistance-change memory element are getting more attention. The STT-MRAM is a non-volatile memory that accomplishes a high-speed performance and a rewriting tolerance similar to those of a Dynamic Random Access Memory (DRAM), and for example, application of a differential pair structure, and introduction to a cache instead of a Static Random Access Memory (SRAM) have been studied.

However, STT-MRAMs generate leak currents, such as a sub threshold current (weak inversion current) of a Metal Oxide Semiconductor Field-Effect Transistor (MOSFET) for actuating the MJT element, and a current flowing through the MJT element.

One solution to such a leak current is to cut off power supply to a circuit while the circuit is not actuated (power gating).

As an example power gating, Non Patent Literature 1 indicates that a PL drier is provided for each of 32 differential pair STT-MRAM cells laid out along a word line, and the PL driver controls the power supply to the MTJ cell. That is, the 32 cells are taken as a group (grain) subjected to the control.

CITATION LIST

Non Patent Literature

Non Patent Literature 1: T. Ohsawa et al., "A 1-Mb Nonvolatile Embedded Memory Using 4T2MTJ Cell With 32 b Fine-Grained Power Gating Scheme", IEEE Journal of Solid-State Circuits, Vol. 48, No. 6, p. 1511, 2013

SUMMARY OF INVENTION

Technical Problem

From the stand point of, however, the access time, the cycle time, and the efficiency of actuating current, reduction of the size of the grain as much as possible, that is, reduction of the number of memory cells contained in a single grain as much as possible is desirable to perform power gating.

When, for example, there is only a single memory cell in a single grain, an AND gate for power saving is necessary for each memory cell. According to the power gating that utilizes the AND gate and disclosed in Non Patent Literature 1, however, since normally six transistors are utilized for the AND gate, the structure becomes complex, and the occupied area for power gating becomes large, preventing an accomplishment of a high integration.

The present disclosure has been made in view of the foregoing circumstances, and an objective of the present disclosure is to perform power gating small bit by small bit with a simple structure.

Solution to Problem

In order to accomplish the above objective, a memory cell according to a first aspect of the present disclosure is connected to a word line, a pair of bit lines, and a power supply line, and includes:

a flip-flop storing data based on resistance values in a pair of magnetic tunnel junction elements; and a power gating field-effect transistor including a current path which has one end connected to the power supply line, and which has another end connected to the flip-flop, ON and OFF states of the power gating field-effect transistor are controlled based on a control signal applied to a control terminal of the power gating field-effect transistor.

For example, the flip-flop includes two inverters that are cross-coupled each including a magnetic tunnel junction element and a field-effect transistor, and the another end of the current path of the power gating field-effect transistor is connected to a common node connected to the two magnetic tunnel junction elements constructing the two inverters.

For example, respective output terminals of the two inverters are connected to the pair of bit lines through a pair of field-effect transistors constructing a pair of transfer gates; and a control terminal of the transfer gate is connected to the word line.

The word line and the power supply line may be designed as a common line. In this case, the one end of the current path of the power gating field-effect transistor is connected to the word line.

The memory cell further includes, for example, a control line to control the ON and OFF states of the power gating field-effect transistor.

For example, a gate of the power gating field-effect transistor is connected to a field-effect transistor whose conductivity-type is the same as the power gating field-effect transistor, and a predetermined voltage is applied to a gate of the control field-effect transistor.

In order to accomplish the above objective, a memory cell according to a second aspect of the present disclosure is connected to a word line, a pair of bit lines, and a power supply line, and includes:

a flip-flop storing data based on resistance values of a pair of non-volatile memory elements; and a power gating field-effect transistor including a current path which has one end connected to the power supply line, and which has another end connected to the flip-flop, ON and OFF states of the power gating field-effect transistor are controlled based on a control signal applied to a control terminal of the power gating field-effect transistor.

In order to accomplish the above objective, a storage device according to a third aspect of the present disclosure includes the above memory cells, in which:

the memory cells are laid out in a matrix;

the word line is connected to a plurality of the memory cells in a row;

the bit lines are connected to a plurality of the memory cells in a column;

the power supply line is connected to the plurality of the memory cells in the row;

the one end of the current path of the power gating field-effect transistor is connected to the power supply line, and the another end of the current path of the power gating field-effect transistor is connected to the flip-flop of the one or a plurality of the memory cells; and the storage device further comprising means for controlling ON and OFF states of the power gating field-effect transistor.

For example, the power supply line may be the word line.

Advantageous Effects of Invention

According to the present disclosure, power gating is enabled small bit by small bit using an element that has a small occupied area.

DESCRIPTION OF EMBODIMENTS

Embodiments of the present disclosure will be explained below with reference to the accompanying figures.

(First Embodiment)

Figure 1:
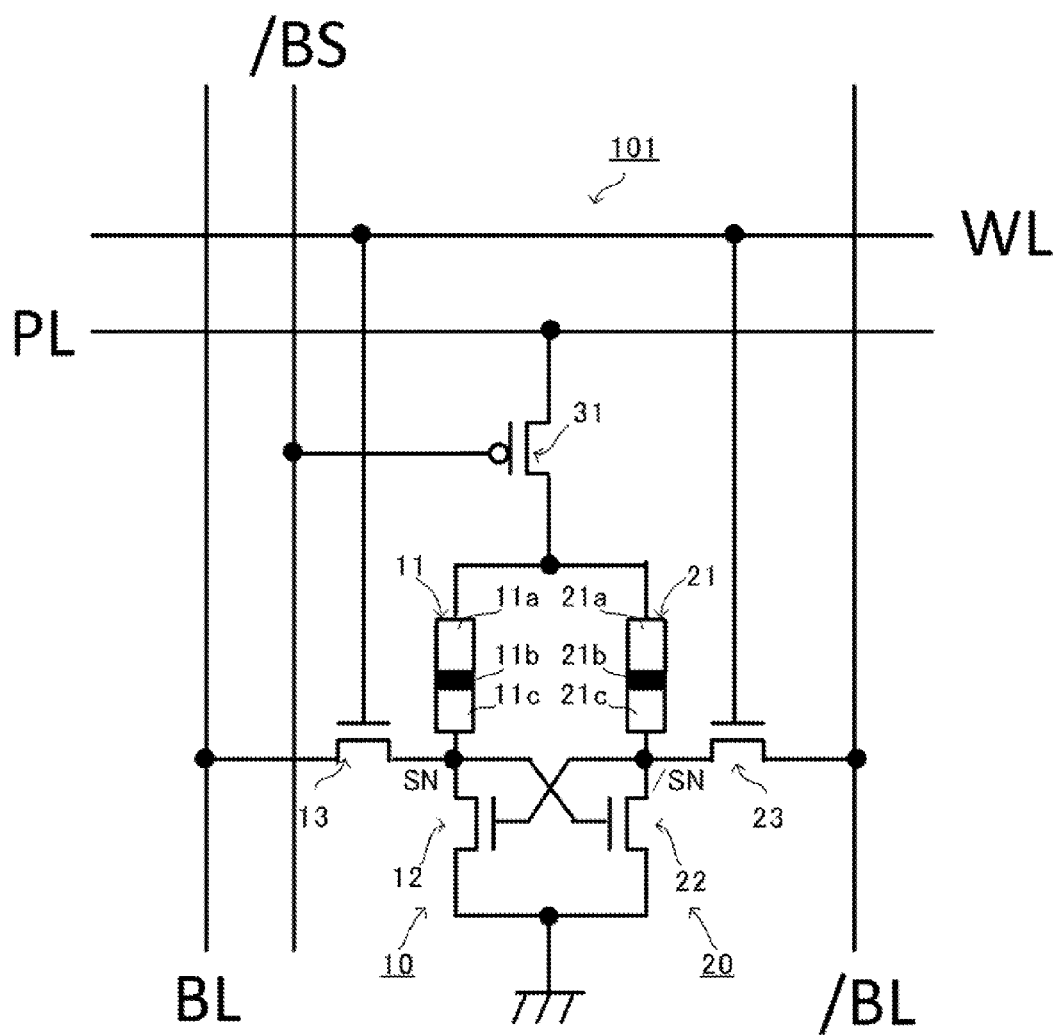
FIG. 1 is a diagram illustrating a circuit structure of a memory cell according to a first embodiment.

FIG. 1 illustrates the circuit structure of a memory cell 101 according to a first embodiment. The memory cell 101 includes a flip-flop circuit that has inverters 10, 20 including MTJ elements and MOSFETs to actuate the MTJ elements. The inverter 10 includes an MTJ element 11, and an actuating MOSFET 12 that has a current path connected in series with the MTJ element 11. The inverter 20 includes an MTJ element 21, and an actuating MOSFET 22 that has a current path connected in series with the MTJ element 21. The N-type MOSFETs (hereinafter, each referred to as an N-MOSFET) 12, 22 construct a differential pair.

The MTJ element 11 has a free layer 11c connected to the drain of the N-MOSFET 12. The MTJ element 21 has a free layer 21c connected to the drain of the N-MOSFET 22. The N-MOSFETs 12, 22, have respective sources commonly connected to each other and grounded.

The N-MOSFET 12 has the drain connected to the gate of the N-MOSFET 22, and the N-MOSFET 22 has the drain connected to the gate of the N-MOSFET 12. The MTJ element 11, the MTJ element 21, the N-MOSFET 12, and the N-MOSFET 22 construct a differential circuit.

A connection node SN between the MTJ element 11 and the N-MOSFET 12 is connected to a bit line BL through the current path of the N-MOSFET 13 that is a transfer gate. A connection node/SN between the MTJ element 21 and the N-MOSFET 22 is connected to an inverse bit line/BL through the current path of the N-MOSFET 23 that is a transfer gate. The gate of the N-MOSFET 13 and that of the N-MOSFET 23 are both connected to a word line WL.

The memory cell 101 includes a P-type MOSFET (hereinafter, referred to as a P-MOSFET) 31 that is a transistor for power gating. The source, gate, and drain of the P-MOSFET 31 are connected to a power line PL, a bit select line/BS, and respective pin layers 11a, 21a, of the MTJ elements 11, 21, respectively.

With a control signal (voltage signal) being input from the power line PL, when a low-level selection control signal (voltage signal) is input from the bit select line/BS, the P-MOSFET 31 becomes an ON state, and a voltage is applied to the MTJ elements 11, 21 from the power line PL.

Figure 2:
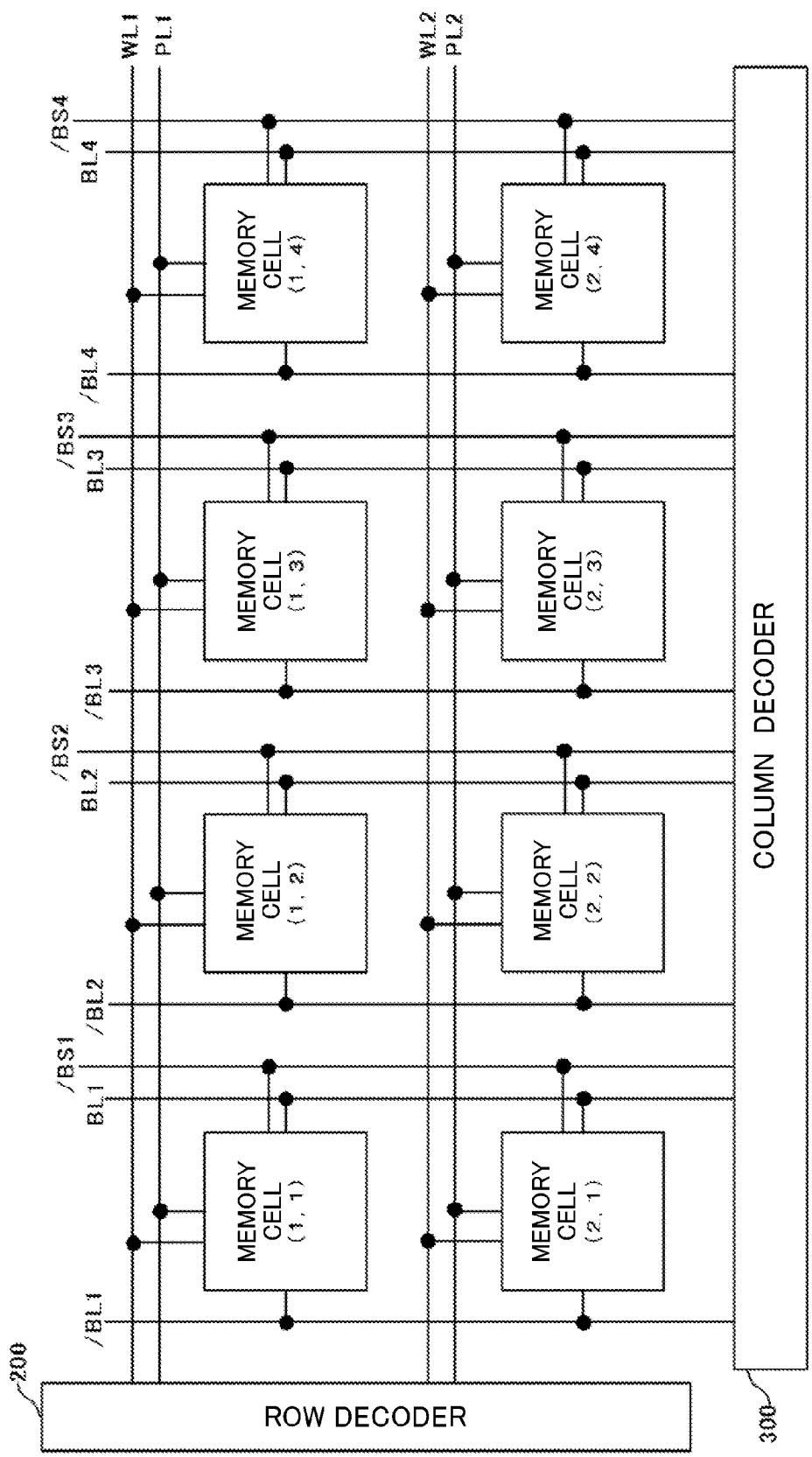
FIG. 2 is a diagram illustrating an example layout of the memory cells.

The memory cell 101 employing the above structure is laid out as illustrated in FIG. 2. Note that FIG. 2 illustrates an example structure in which the memory cells are laid out in a two by four layout. Each memory cell 101 is allocated with one power line PL and one bit select line/BS. A row decoder 200 selects and actuates the word line WL, and supplies power to the memory cell 101 that is connected through the power line PL. A column decoder 300 applies a complementary voltage to the bit line BL and the inverse bit line/BL at the time of writing, thereby writing data in the memory cell 101. The column decoder 300 determines the voltage relationship between the bit line BL and the inverse bit line/BL by a sensing amplifier at the time of reading, thereby reading the data from the memory cell 101. In addition, the column decoder 300 outputs, through the bit select line/BS, a control signal to the transistor for power gating which is to supply power to the memory cell 101.

Figure 3A:
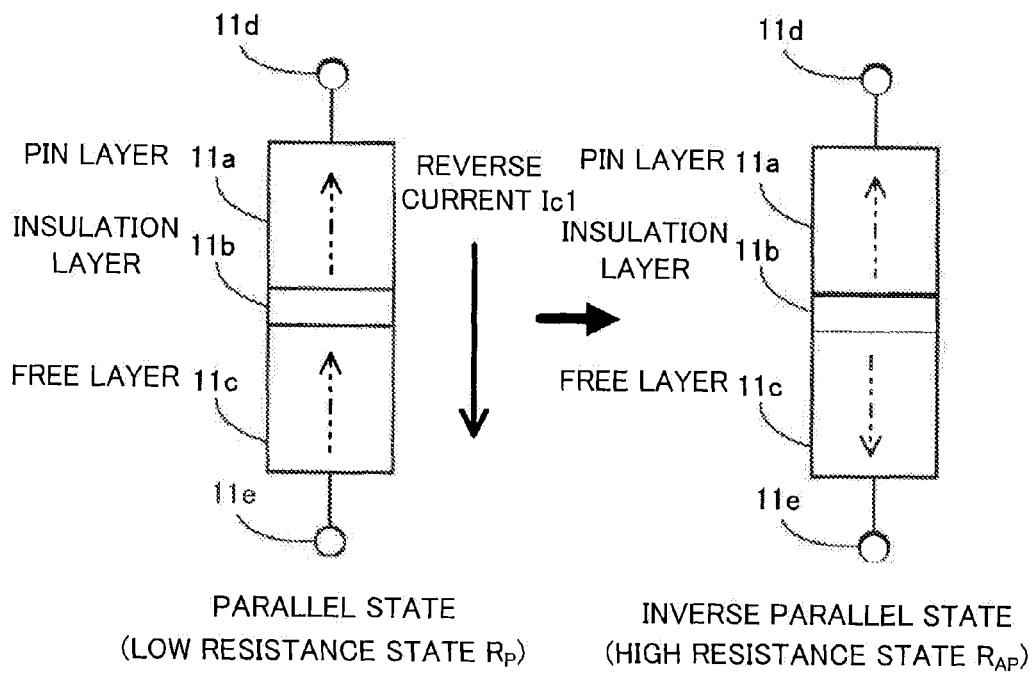
FIG. 3A is a diagram illustrating a structure of an MTJ element.
Figure 3B:
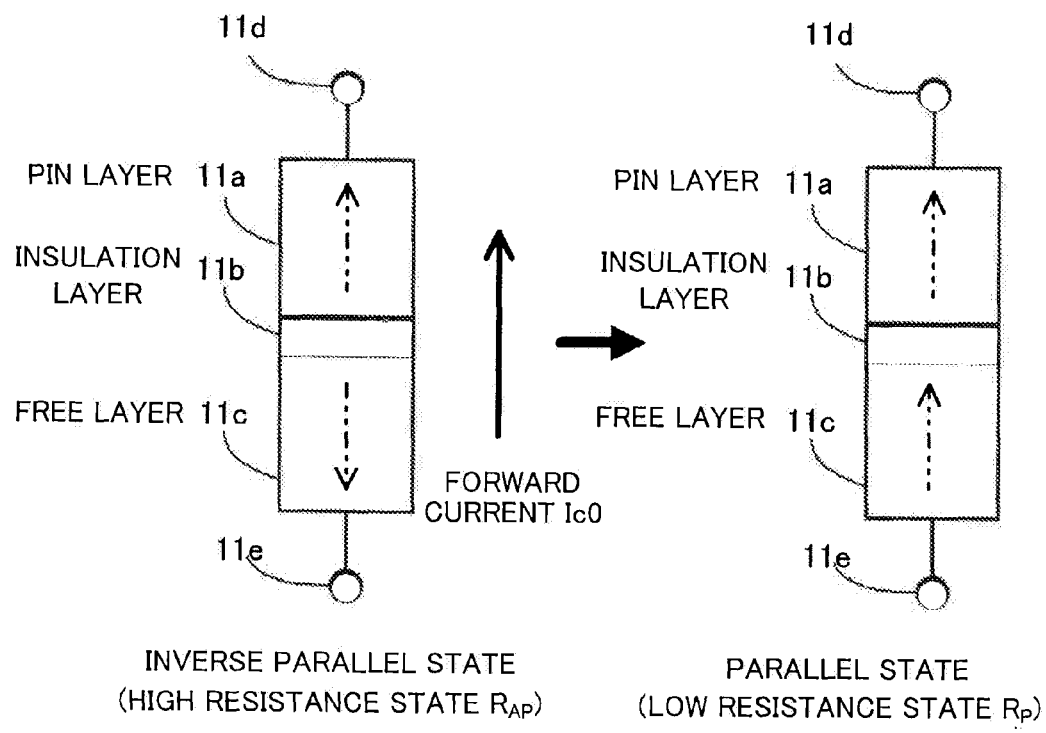
FIG. 3B is a diagram illustrating the structure of the MTJ element.

The MTJ elements 11, 21 illustrated in FIG. 1 employ the same structure with each other. Hence, the structure of the MTJ element 11 will be explained below as an example. As illustrated in FIGS. 3A and 3B, the MTJ element 11 includes three layers that are the pin layer 11a, an insulation layer 11b, and the free layer 11c. The insulation layer 11b is a thin film formed of MgO or $Al_2O_3$, and, the pin layer 11a and the free layer 11c are each a layer or multiple layers formed of a ferromagnetic material, such as iron (Fe) or a cobalt (Co), or an alloy thereof. In addition, the pin layer 11a, and the free layer 11c are formed with an electrode 11d, an electrode 11e, respectively.

The free layer 11c has the direction of magnetization not fixed as indicated by a two-dot-chain line arrow, and when a current is supplied, the direction of magnetization changes.

In addition, the pin layer 11a has the fixed direction of magnetization. The left drawing in FIG. 3A illustrates a state (parallel state) in which the pin layer 11a and the free layer 11c have the aligned directions of magnetization, while the left drawing in FIG. 3B illustrates a state (inverse parallel state) in which the pin layer 11a and the free layer 11c have opposite directions of magnetization.

Figure 4:
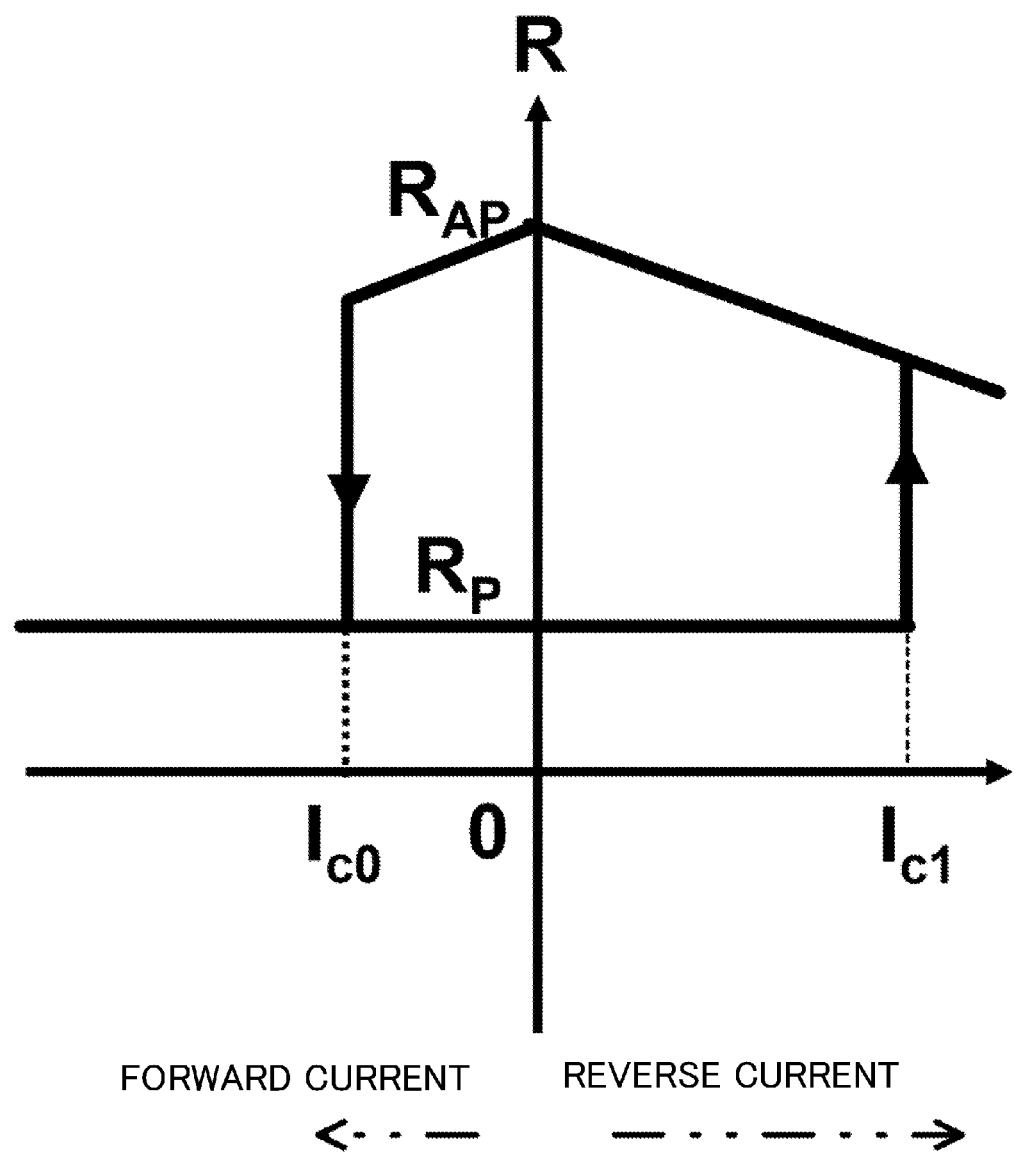
FIG. 4 is a diagram illustrating a current-resistance characteristic of the MTJ element.

The MTJ element 11 that is a resistance-change memory element has characteristics that the resistance value differs in the parallel state and in the inverse parallel state. FIG. 4 illustrates a current-resistance characteristic of the MTJ element 11. In this case, the vertical axis represents a resistance, while the horizontal axis represents a current supplied to an MTJ element 11. The MTJ element 11 has the resistance value that changes in accordance with a relative direction between the direction of magnetization of the pin layer 11a and that of the free layer 11c. This resistance change is called a tunnel magnetic resistance effect. When the pin layer 11a and the free layer 11c have the respective directions of magnetization in parallel with each other, the magnetic resistance of the MTJ element 11 decreases. This state is called a low resistance state $R_P$. Conversely, when the respective directions of magnetization are opposite, the magnetic resistance increases. This state is called a high resistance state $R_{AP}$.

As illustrated in FIG. 3B, in the inverse parallel state, when a current (forward current Ic0) is supplied in a direction from the free layer 11c to the pin layer 11a, the magnetization of the free layer 11c is inverted by the spinning electrons which are injected from the pin layer 11a to the free layer 11c, and which are in parallel with the magnetization of the pin layer 11a, and thus the MTJ element 11 becomes the parallel state (low resistance state $R_P$). Conversely, as illustrated in FIG. 3A, in the parallel state, when a current (reverse current Ic1) is supplied in a direction from the pin layer 11a to the free layer 11c, spinning electrons are injected from the free layer 11c to the pin layer 11a, but the spinning electrons inversely parallel to the magnetization of the free layer 11c are reflected by the insulation layer 11b. Hence, the magnetization of the free layer 11c is inverted, and thus the MTJ element 11 becomes the inverse parallel state (high resistance state $R_{AP}$).

When the reverse current Ic1 is supplied in the inverse parallel state, the state is maintained and remains unchanged, and when the forward current Ic0 is supplied in the parallel state, this state is also maintained.

The parallel state and the inverse parallel state are associated with, for example, "0" and "1", and by controlling, for each of the MTJ elements 11, 21, the parallel state ("0") and the inverse parallel state ("1"), information by 1 bit can be stored using the MTJ elements 11, 21.

Figure 5A:
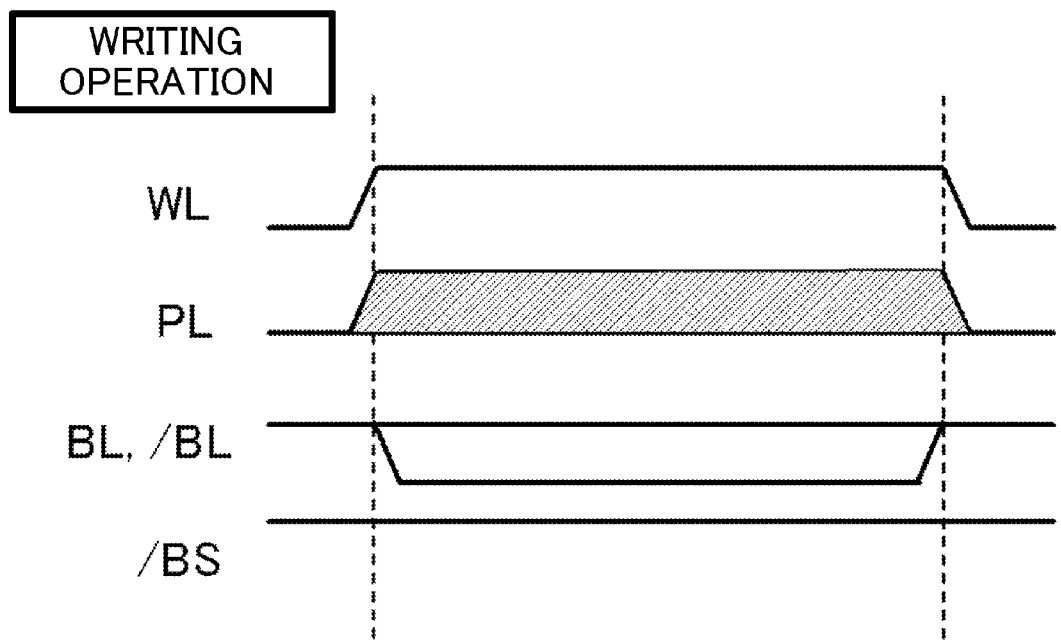
FIG. 5A is a diagram illustrating a signal waveform in a writing operation.
Figure 5B:
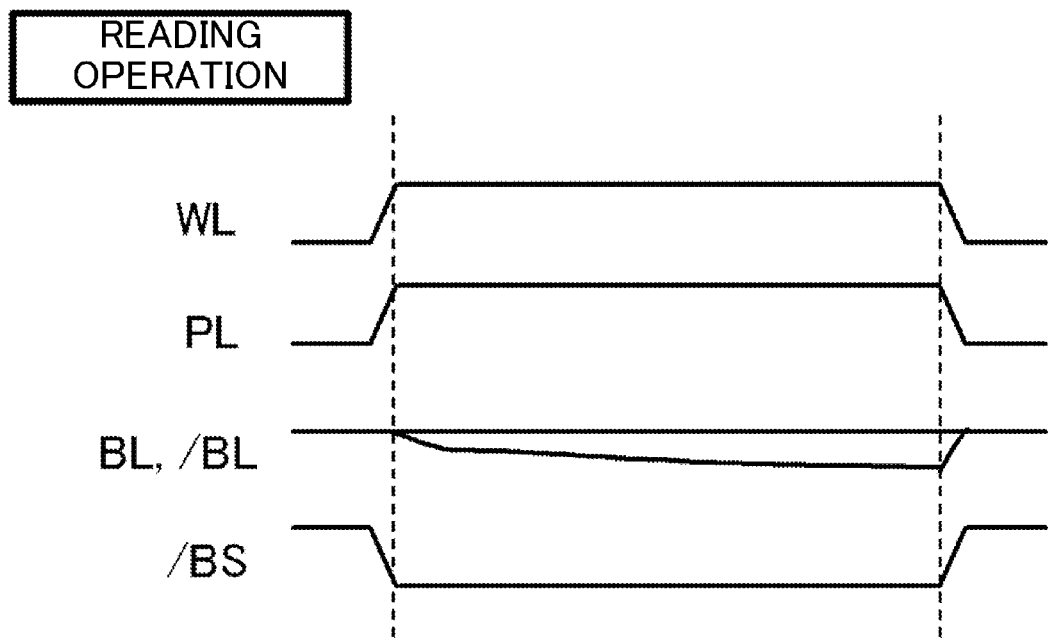
FIG. 5B is a diagram illustrating a signal waveform in a reading operation.

Next, an explanation will be given of an operation of the memory cell 101 with reference to FIGS. 5A, 5B. FIG. 5A illustrates a signal waveform supplied from each signal line at the time of writing to the memory cell 101. Note that FIG. 5B illustrates a signal waveform supplied from each signal line at the time of reading of data from the memory cell 101, and a reading waveform. The same is true of waveforms to be explained later.

In the following example case, the example memory cell 101 subjected to an access is assumed as a memory cell (1, 1) in FIG. 2. At the time of writing, the row decoder 200 decodes row address data, and sets a word line WL1 connected to the memory cell 101 subjected to an access to be a high level (active level). Hence, the N-MOSFET 13 and the N-MOSFET 23 become the ON state.

Conversely, the column decoder 300 sets a bit select line/BS1 to be a high level. Hence, the P-MOSFET 31 is turned OFF. Accordingly, no matter what voltage is applied to a power line PL1, the memory cell 101 is not affected by such a voltage application. Hence, the row decoder 200 applies an arbitrary voltage to the power line PL1 (ground level is desirable from the standpoint of energy saving).

A writing circuit of the column decoder 300 applies, to a bit line BL1 and an inverse bit line/BL1 both connected to the memory cell (1, 1) subjected to writing, high level and low level, or low level and high level voltages in accordance with whether data to be written is "1" or "0".

In this case, assuming that the high level voltage and the low level voltage are applied to the bit line BL1 and the inverse bit line/BL1, respectively, the current from the bit line BL1 flows from the free layer 11c of the MTJ element 11 to the pin layer 11a through the N-MOSFET 13 and the node SN. The current that has passed through the MTJ element 11 flows from the pin layer 21a of the MTJ element 21 to the free layer 21c, and flows to the inverse bit line/BL1 through the node/SN and the N-MOSFET 23.

As explained above, since the current flows from the free layer 11c of the MTJ element 11 to the pin layer 11a, when the MTJ element 11 is in the high resistance state $R_{AP}$, the MTJ element 11 transitions to the low resistance state $R_P$. That is, the MTJ element 11 is rewritten. Conversely, when the MTJ element 11 is in the low resistance state $R_P$, the resistance state of the MTJ element 11 remains unchanged.

In addition, as for the MTJ element 21, since the current flows from the pin layer 11a to the free layer 11c, when the MTJ element 21 is in the low resistance state $R_P$, the MTJ element 21 transitions to the high resistance state $R_{AP}$. That is, the MTJ element 21 is rewritten. Conversely, when the MTJ element 21 is in the high resistance state $R_{AP}$, the resistance state of the MTJ element 21 remains unchanged.

As explained above, since the MTJ elements 11, 21 are laid out in series so as to have different directions of the respective pin layers of the MTJ elements 11, 21 relative to the current, the MTJ elements 11, 21 are rewritten simultaneously.

At the time of reading, the row decoder 200 decodes row address data, and sets the word line WL1 and the power line PL1 both connected to the memory cell 101 subjected to an access to be the high level (active level). Hence, the N-MOSFET 13 and the N-MOSFET 23 become the ON state. Conversely, the column decoder 300 decodes a column address, and sets the bit select line/BS1 to be low level. Hence, the P-MOSFET 31 is turned ON.

Since the P-MOSFET 31 is turned ON, the current from the power line PL1 flows through the MTJ elements 11, 21, and thus power is supplied to the flip-flop.

When the MTJ element 11 is in the high resistance state $R_{AP}$ and the MTJ element 21 is in the low resistance state $R_P$, the current flowing through the MTJ elements 11, 21 causes the potential at a second connection node/SN to be relatively high, and the potential at the connection node SN to be relatively low. The inverters 10, 20 amplify and stabilize those potentials.

Hence, the potential of the bit line BL1 that has been pre-charged decreases, and the potential of the inverse bit line/BL1 maintains the high level. A reading circuit of the column decoder 300 determines the voltage relationship between the bit line BL1 and the inverse bit line/BL1 by a sensing amplifier, thereby reading the data stored in the memory cell (1, 1). As explained above, by the bit select line/BS and the power line PL, individual memory cell is selected, and power gating can be performed bit by bit. As explained above, according to this embodiment, data writing to the memory cell 101 and data reading from the memory cell 101 are enabled by a single P-MOSFET 31 for power control while controlling power supply to the memory cell 101.

(Second Embodiment)

In the first embodiment, as illustrated in FIGS. 5A, 5B, the voltage of the power line PL at the time of writing is not limited to any particular voltage, and the word line WL and the power line PL at the time of reading have the same voltage waveform. Hence, an explanation will be given below of a second embodiment in which the word line WL and the power line PL are designed as a common line.

Figure 6A:
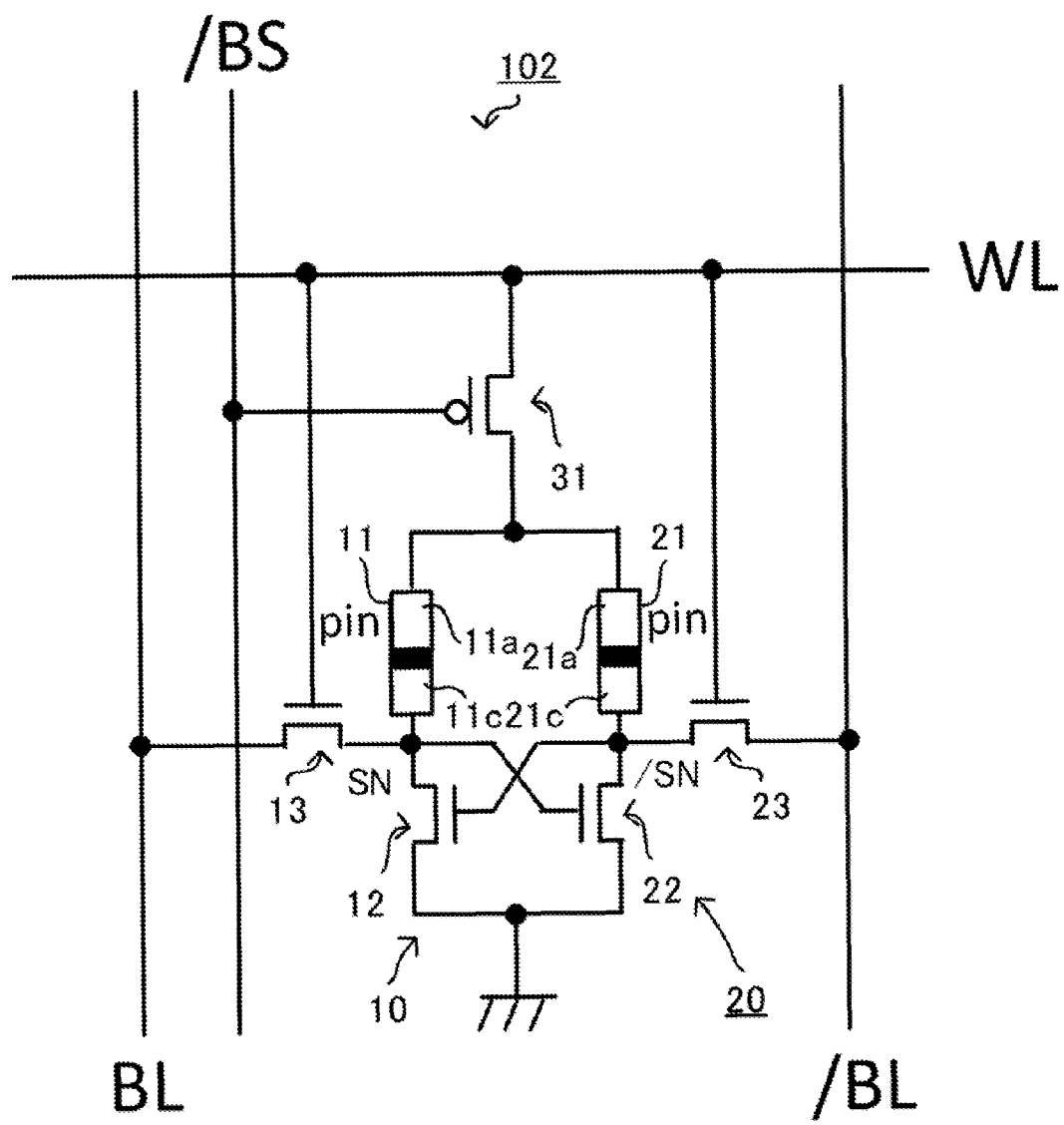
FIG. 6A is a diagram illustrating a circuit structure of a memory cell according to a second embodiment.
Figure 6B:
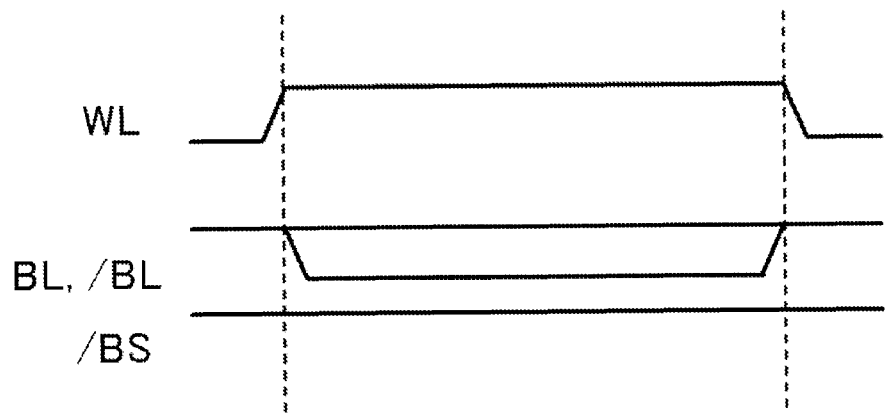
FIG. 6B is a diagram illustrating a signal waveform of each component in a writing operation.
Figure 6C:
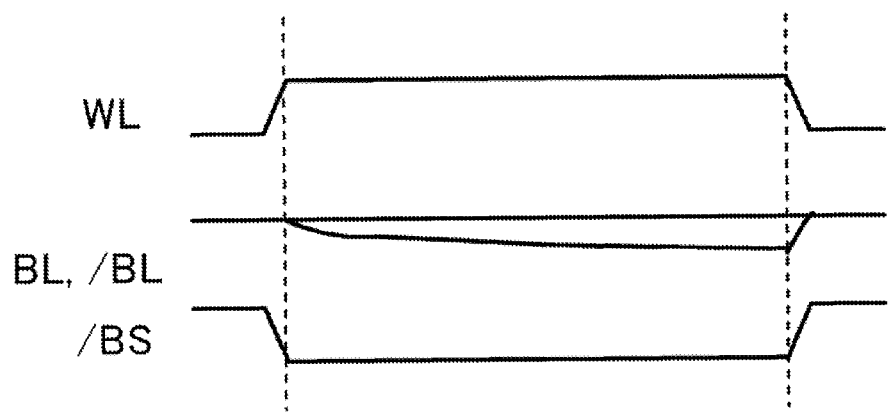
FIG. 6C is a diagram illustrating a signal waveform of each component in a reading operation.

FIG. 6A illustrates the circuit structure of a memory cell 102 according to the second embodiment. The memory cell 102 employs the circuit structure basically the same as that of the memory cell in the first embodiment, but the power line PL utilized in the first embodiment is designed so as to also serve as the word line WL, and the current, is supplied from the word line WL to the source of the P-MOSFET 31 that is a transistor for power gating. As illustrated in FIGS. 6A, 6B, the writing and reading operations of the memory cell 102 are basically the same as those of the first embodiment. That is, at the time of writing, the row decoder 200 decodes the row address data, and sets the word line WL connected to the memory cell 101 subjected to an access to be the high level (active level). Hence, the N-MOSFET 13 and the N-MOSFET 23 become the ON state. Conversely, the column decoder 300 maintains the bit select line/BS1 to be the high level. Hence, the P-MOSFET 31 is turned OFF. In addition, the writing circuit of the column decoder 300 applies voltages to the bit lines BL1 and/BL1 in accordance with the data to be written. Hence, the current flows through the MTJ element 11 and the MTJ element 21 connected in series, and are set to be the resistance state corresponding to the writing data.

At the time of reading, the row decoder 200 decodes the row address data, and sets the word line WL connected to the memory cell 101 subjected to an access to be the high level (active level). Hence, the N-MOSFET 13 and the N-MOSFET 23 become the ON state. Conversely, the column decoder 300 decodes the column address and sets the bit select line/BS1 to be the low level. Hence, the P-MOSFET 31 is turned ON.

Since the P-MOSFET 31 is turned ON, the current from the power line PL1 flows through the MTJ elements 11, 21. Hence, a voltage corresponding to the stored data appears on the connection nodes SN and/SN, and is transmitted to the bit line BL1 and to the inverse bit line/BL1. This voltage relationship is determined by the sensing amplifier, and thus the data stored in the memory cell (1, 1) is read.

As explained above, according to the second embodiment, the power line PL and the word line WL are designed as the common line, and thus the number of wirings in the memory cell can be reduced. Therefore, the memory cell can be made compact.

(Third Embodiment)

Figure 7A:
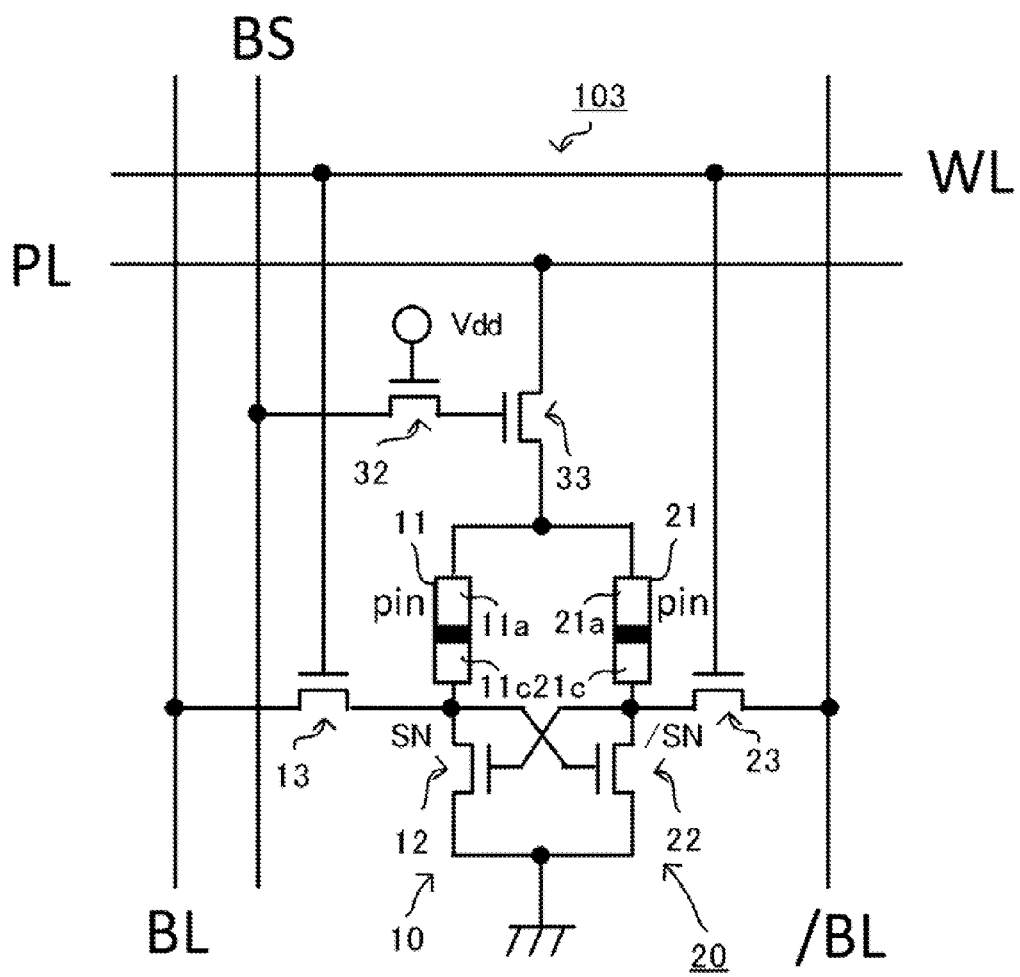
FIG. 7A is a diagram illustrating a circuit structure of a memory cell according to a third embodiment.

An explanation will be given of a memory cell 103 according to a third embodiment. In the third embodiment, two N-MOSFETs that are transistors for power gating are utilized. FIG. 7A illustrates the circuit structure of the memory cell 103 according to the third embodiment. The memory cell 103 employs the circuit structure substantially the same as that of the memory cell 101 in the first embodiment, but instead of the P-MOSFET 31 in the first embodiment, the memory cell 103 includes an N-MOSFET 33 for power gating, and an N-MOSFET 32 that is a transistor to control the N-MOSFET 33.

An explanation will be mainly given below of the difference from the first embodiment. The pin layer 11a of the MTJ element 11 and the pin layer 21a of the MTJ element 21 are both connected to the drain of the N-MOSFET 33. The N-MOSFET 33 has the source connected to the power line PL, and has the gate connected to the drain of the N-MOSFET 32.

A power-supply voltage Vdd to actuate the N-MOSFET 32 is always supplied to the gate of the N-MOSFET 32. The N-MOSFET 32 has the source connected to the bit select line BS. According to such a structure, when the N-MOSFET 33 is in the ON state, power is supplied from the power line PL to the MTJ elements 11, 21.

Figure 7B:
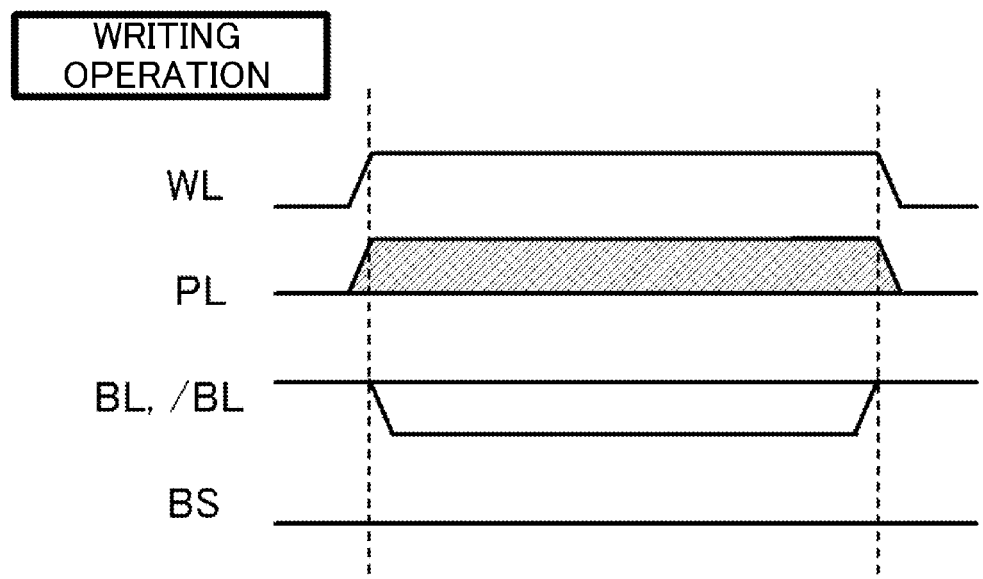
FIG. 7B is a diagram illustrating a signal waveform of each component in a writing operation.

FIG. 7B illustrates a waveform of a signal on each signal line at the time of writing to the memory cell 103. At the time of writing, the control signal (voltage signal) supplied from the bit select line BS is in a reverse phase from that of the first embodiment, and is the low level.

Since the bit select line BS is set to be the low level at the time of writing, the N-MOSFET 33 is turned OFF. Hence, no matter what voltage is applied to the power line PL, the memory cell 103 is not affected by such a voltage application. Conversely, when the voltage of the word line WL becomes the high level, the N-MOSFET 13 and the N-MOSFET 23 that are the transfer gates are opened. Hence, a current flows between the bit line BL and the inverse bit line/BL, and thus writing is performed on the MTJ elements 11, 21.

Figure 7C:
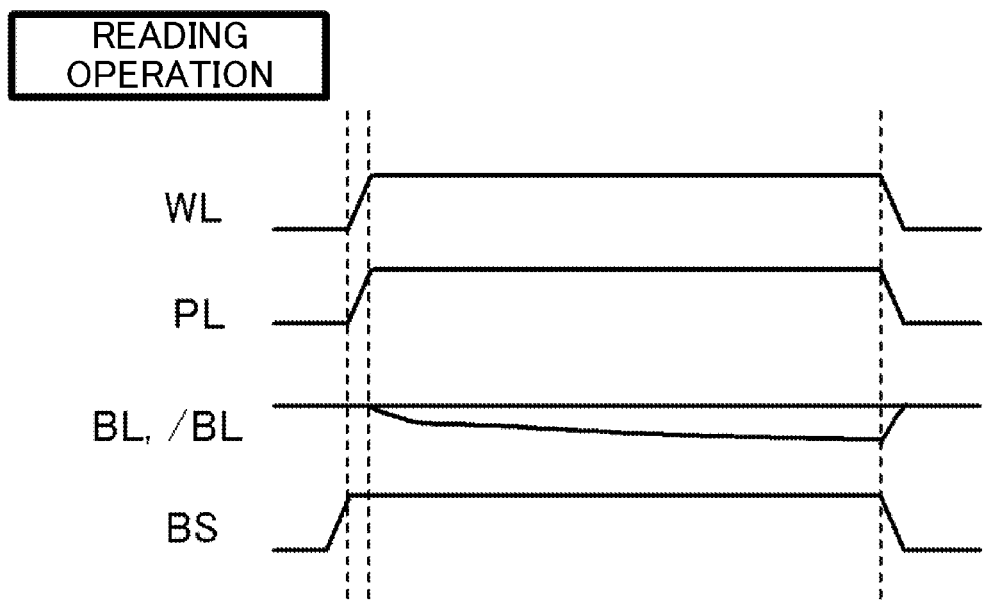
FIG. 7C is a diagram illustrating a signal waveform of each component in a reading operation.

FIG. 7C illustrates a waveform of a signal on each signal line when reading is performed on the memory cell 103. The power supply to the memory cell 103 is performed by, from the power line PL, the N-MOSFET 32 that becomes the ON state when the bit select line BS becomes the high level, and, the N-MOSFET 33 that operates in conjunction with the N-MOSFET 32 when the N-MOSFET 32 becomes the ON state. Hence, before the power line PL is set to be the high level, the bit select line BS needs to be set to the high level in advance.

When both of the voltage of the bit select line BS and that of the word line WL become the high level, the N-MOSFET 33 is turned ON, and the current flows through the MTJ elements 11, 21 from the power line PL. The voltages at the connection nodes SN and/SN are transmitted to the bit line BL and the inverse bit line/BL, and thus data is read.

Since the memory cell 103 is a circuit that has no P-MOSFET, a formation of an N-well for such a P-MOSFET on a substrate is unnecessary when the memory cell is formed, and thus the cell size can be reduced in comparison with a circuit that includes both the N-MOSFETs and the P-MOSFET.

(Fourth Embodiment)

According to the first to third embodiments explained above, at the time of writing, the current is supplied to the closed-loop current path that includes the MTJ elements 11, 21, thereby performing a simultaneous writing on the MTJ elements 11, 21. However, the writing method is not limited to this example, and for example, the following method is also applicable.

Figure 8A:
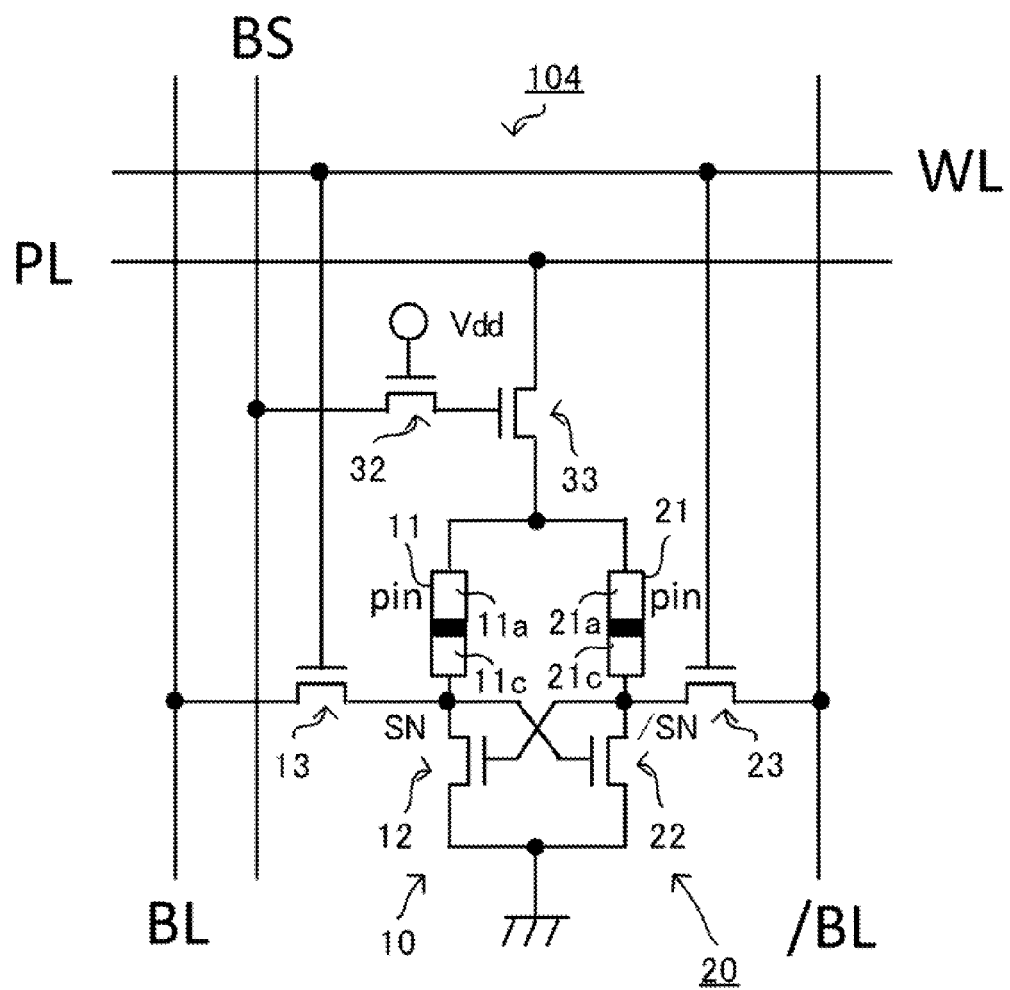
FIG. 8A is a diagram illustrating a circuit structure of a memory cell according to a fourth embodiment.
Figure 8B:
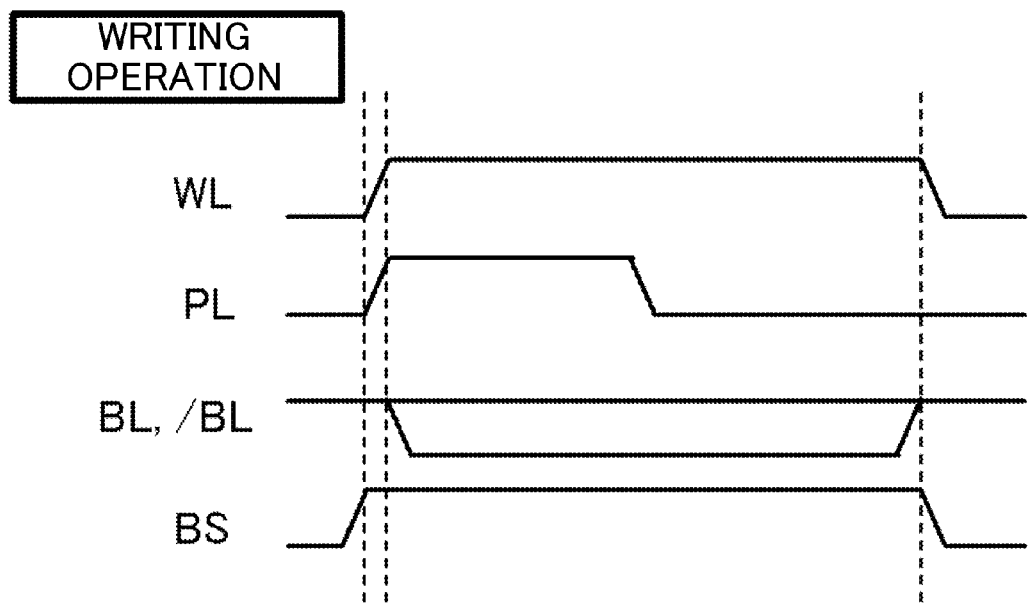
FIG. 8B is a diagram illustrating a signal waveform of each component in a writing operation.
Figure 8C:
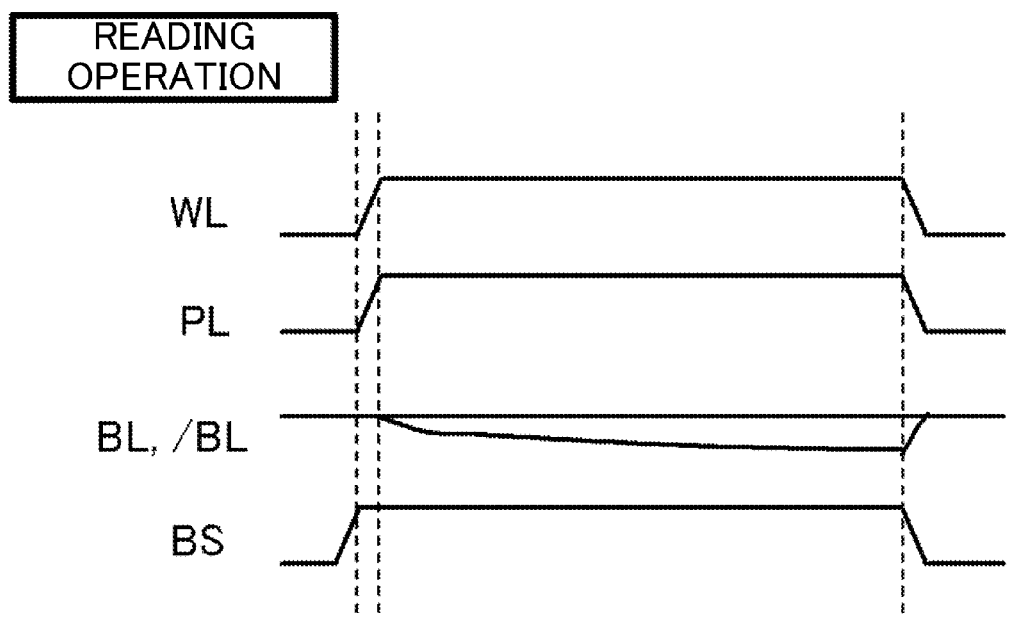
FIG. 8C is a diagram illustrating a signal waveform of each component in a reading operation.

FIG. 8A illustrates the circuit structure of a memory cell 104 according to a fourth embodiment. The memory cell 104 employs the same circuit structure as that of the memory cell 103 in the third embodiment. FIG. 8B illustrates a waveform of a signal on each signal line at the time of writing performed on the memory cell 104.

The power-supply voltage Vdd is applied to the gate of the N-MOSFET 32. The bit select line BS is set to be the high level, and the gate potential of the N-MOSFET 33 increases to Vdd-Vth. In this case, Vth is a threshold voltage of the N-MOSFET 32. After a predetermined time has elapsed since the bit select line BS becomes the high level, the word line WL is set to be the high level, and the N-MOSFET 13, the N-MOSFET 23 become the ON state. The power line PL is also set to be the high level like the word line WL, the gate voltage of the N-MOSFET 33 exceeds the voltage value of het power-supply voltage Vdd, and thus the N-MOSFET 33 becomes the ON state.

The first connection node SN and the second connection node/SN are set to be the high level, and the low level, respectively, through the N-MOSFETs 13, 23 connected to the bit line BL and the inverse bit line/BL, respectively. Hence, when the power line PL at the first half cycle is the high level, the current flows from the power line PL to the first node SN through the MTJ element 21. When the MTJ element 21 is in the low resistance state $R_P$, the amount of current exceeds a threshold, and the MTJ element 21 transitions to the high resistance state $R_{AP}$. Conversely, no current flows through the MTJ element 11, and thus the MTJ element 11 does not change the resistance state.

Next, the power line PL is set to be the low level. In this case, the current flows from the first node SN to the power line PL through the MTJ element 11. When the MTJ element 11 is in the high resistance state $R_{AP}$, the amount of current exceeds a threshold, and the MTJ element 11 transitions to the low resistance state $R_P$. Conversely, no current flows through the MTJ element 21, and thus the MTJ element 21 does not change the resistance state. The writing is performed on the memory cell 104 in this way.

The reading operation of the memory cell 104 is basically the same as that of the third embodiment. According to this structure, voltages are individually applicable to the MTJ element 11 and the MTJ element 21 at the time of data writing. Hence, data can be written at a lower voltage than that of a case in which voltages are applied to the MTJ elements 11, 21 connected in series.

(Fifth Embodiment)

Figure 9A:
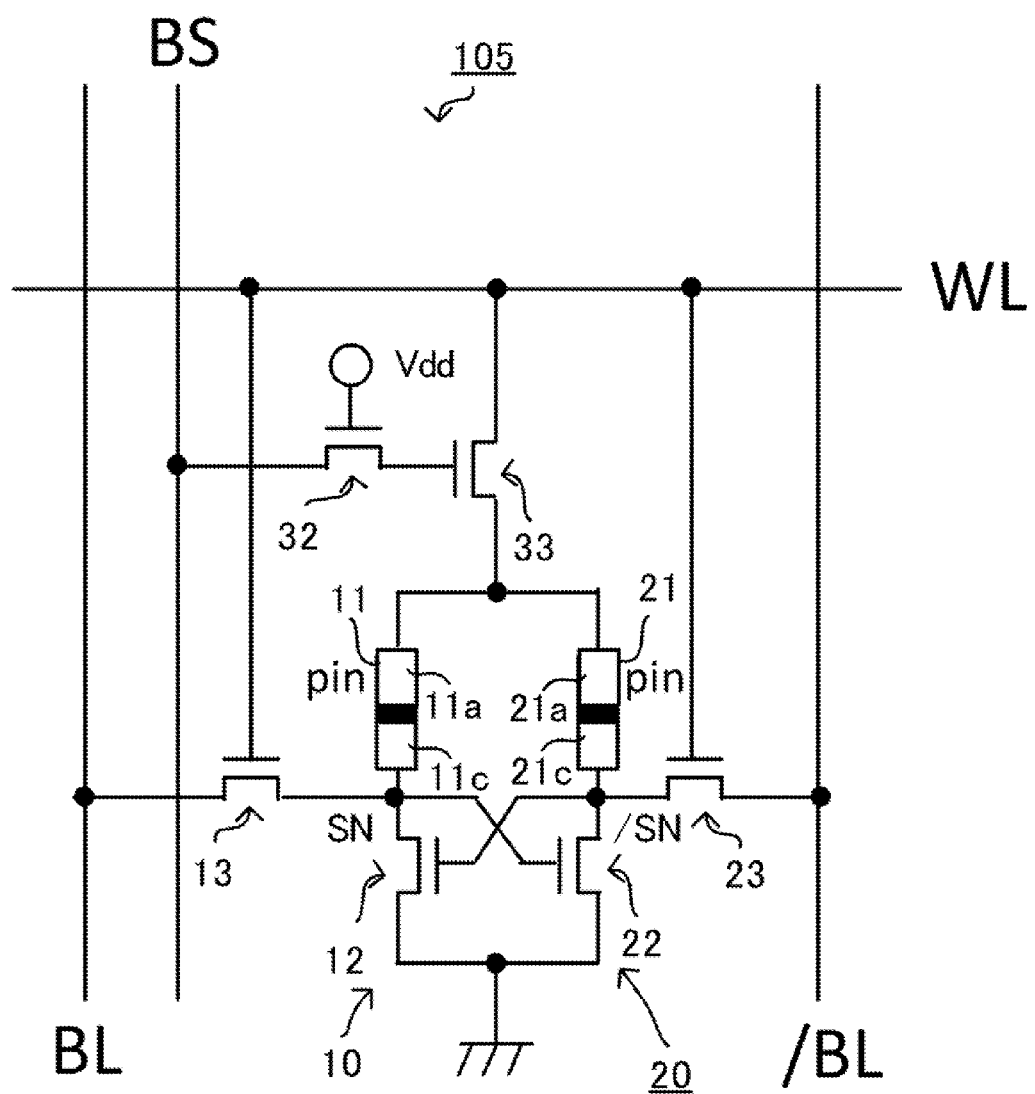
FIG. 9A is a diagram illustrating a circuit structure of a memory cell according to a fifth embodiment.

The memory cell 103 according to the third embodiment is also capable of making the power line PL and the word line WL as a common line. An explanation will be given below of a memory cell 105 according to a fifth embodiment in which the power line PL and the word line WL are designed as a common line. FIG. 9A illustrates the circuit structure of the memory cell 105 according to the fifth embodiment. The memory cell 105 according to the fifth embodiment employs the circuit structure substantially the same as that of the memory cell 103 in the third embodiment, but the power line PL and the word line WL are designed as a common line.

The N-MOSFET 33 has the drain connected to the word line WL. Hence, the voltage is applied to the gate of the N-MOSFET 33 through the N-MOSFET 32, and when the current is supplied from the word line WL, the N-MOSFET 33 becomes the ON state.

Figure 9B:
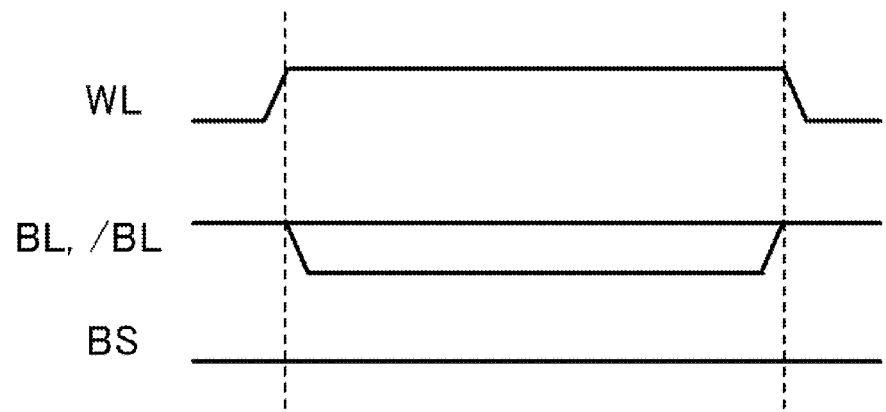
FIG. 9B is a diagram illustrating a signal waveform of each component in a writing operation.

The wiring and reading operations of the memory cell 105 are basically the same as those of the third embodiment. FIG. 9B illustrates a waveform of a signal on each signal line when writing is performed on the memory cell 105. At the time of writing, the control signal (voltage signal) supplied from the bit select line BS is in the reverse phase from that of the first embodiment, and is the low level.

Since the bit select line BS is set to be the low level at the time of writing, the N-MOSFET 33 is turned OFF. Conversely, when the voltage of the word line WL becomes the high level, the transfer gates 13, 23 are opened. Hence, the current flows between the bit line BL and the inverse bit line/BL, and thus writing is performed on the MTJ elements 11, 21.

Figure 9C:
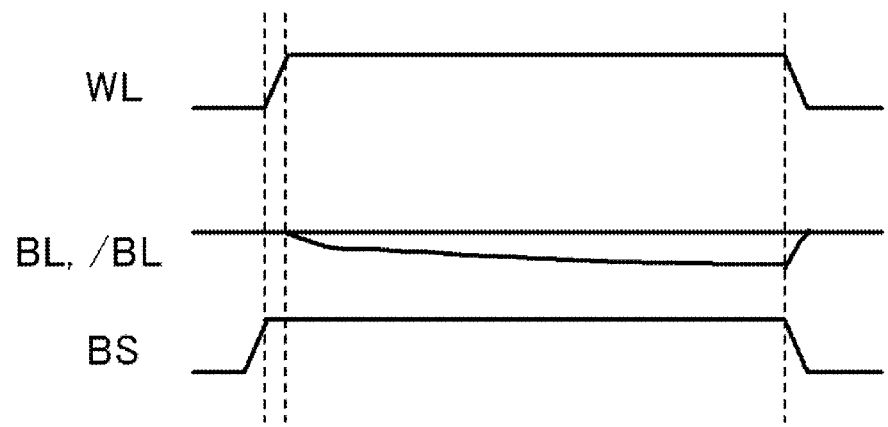
FIG. 9C is a diagram illustrating a signal waveform of each component in a reading operation.

Next, FIG. 9C illustrates a waveform of a signal on each signal line when reading is performed on the memory cell 105.

The power supply to the memory cell 105 is performed by the N-MOSFET 33 that has the gate potential controlled through the N-MOSFET 32. Hence, before the power line PL is set to be the high level, the bit select line BS needs to be set to the high level in advance. When both of the voltage of the bit select line BS and that of the word line WL become the high level, the N-MOSFET 33 is turned ON, and a current flows to the MTJ elements 11, 21 from the power line PL. The voltages at the connection nodes SN and/SN are transmitted to the bit line BL and the inverse bit line/BL, and thus data is read. According to the fifth embodiment, since the power line PL and the word line WL are designed as the common line, the number of wirings in the memory cell can be reduced, and thus the memory cell can be made compact.

(Sixth Embodiment)

Next, an explanation will be given of a sixth embodiment. In the sixth embodiment, a circuit that inverts the polarities of the N-MOSFETs and P-MOSFET included in the memory cell 101 in the first embodiment is applied.

Figure 10A:
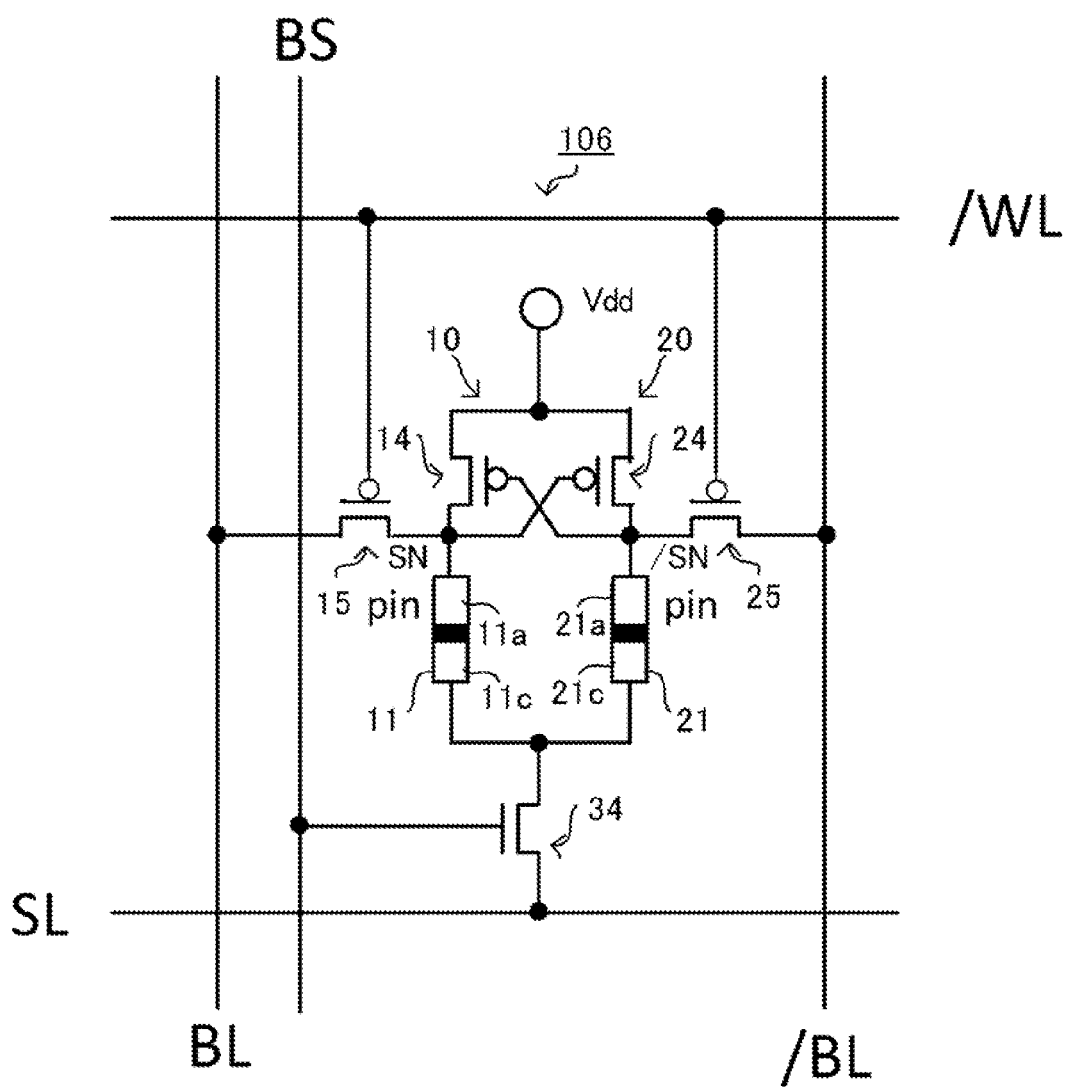
FIG. 10A is a diagram illustrating a circuit structure of a memory cell according to a sixth embodiment.

FIG. 10A illustrates the circuit structure of a memory cell 106 according to the sixth embodiment. The memory cell 106 includes a differential circuit which includes the MTJ elements 11, 21, and P-MOSFETs 14, 24, for actuation.

The MTJ elements 11, 21 employ the same structure as that of the MTJ element 11 in the first embodiment. The MTJ element 11 has the pin layer 11a connected to the drain of the P-MOSFET 14. The MTJ element 21 has the pin layer 21a connected to the drain of the P-MOSFET 24. The MTJ element 11 and the MTJ element 21 has the respective free layers 11c, 21c commonly connected to the drain of an N-MOSFET 34 for power gating. The P-MOSFETs 14, 24 have the respective sources commonly connected to the power supply Vdd.

The P-MOSFET 14 has the drain connected to the gate of the P-MOSFET 24. The P-MOSFET 24 has the drain connected to the gate of the P-MOSFET 14. The first inverter 10 and the second inverter 20 are connected to each other by cross-wiring.

The first connection node SN is connected to the bit line BL through the P-MOSFET 15 that is a transfer gate. The second connection node/SN is connected to the inverse bit line/BL through the P-MOSFET 25 that is a transfer gate. The P-MOSFET 15 and the P-MOSFET 25 have the respective gates connected to the word line/WL.

The N-MOSFET 34 for power gating has the source connected to a control line SL, and has the gate connected to the bit select line BS. The control line SL corresponds to the power line PL in the first embodiment, and is a signal line that supplies a current to actuate the N-MOSFET 34. Like the first embodiment, the bit select line BS is the signal line that supplies the control signal (voltage signal) to select the memory cell 106.

Figure 10B:
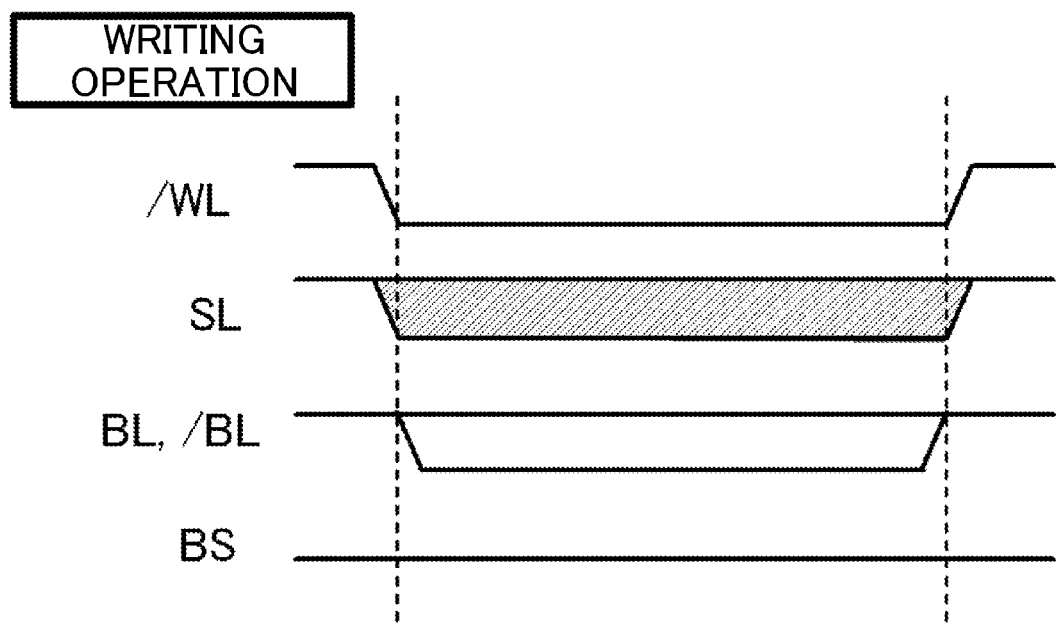
FIG. 10B is a diagram illustrating a signal waveform of each component in a writing operation.

Next, an explanation will be given of an operation of the memory cell 106. FIG. 10B illustrates a waveform of a signal on each signal line when writing is performed on the memory cell 106.

At the time of writing, the low-level selection signal is output to the word line/WL from the row decoder 200. Hence, the P-MOSFET 15 and the P-MOSFET 25 become the ON status. Conversely, the column decoder 300 maintains the bit select line BS to be the low level. Hence, the N-MOSFET 34 is turned OFF. Accordingly, no matter what voltage is applied to the control line SL, the memory cell 106 is not affected by such a voltage application.

In addition, the column decoder 300 sets, for example, the bit line BL and the inverse bit line/BL to be the high level and the low level, respectively, in accordance with data to be written. Hence, the current from the bit line BL flows, through the P-MOSFET 15 and the first connection node SN, to the free layer 11c of the MTJ element 11 from the pin layer 11a. The current that has passed through the MTJ element 11 flows from the free layer 21c of the MTJ element 21 to the pin layer 21a, and flows to the inverse bit line BL through the P-MOSFET 25 and the second connection node/SN.

As explained above, since the current flows from the pin layer 11a of the MTJ element 11 to the free layer 11c, when the MTJ element 11 is in the low resistance state $R_P$, the MTJ element 11 transitions to the high resistance state $R_{AP}$. That is, the MTJ element 11 is rewritten.

In addition, as for the MTJ element 21, since the current flows from the free layer 21c to the pin layer 21a, when the MTJ element 21 is in the high resistance state $R_{AP}$, the MTJ element 21 transitions to the low resistance state $R_P$. That is, the MTJ element 21 is rewritten.

In addition, at the time of reading, the memory cell 106 operates as follow.

Figure 10C:
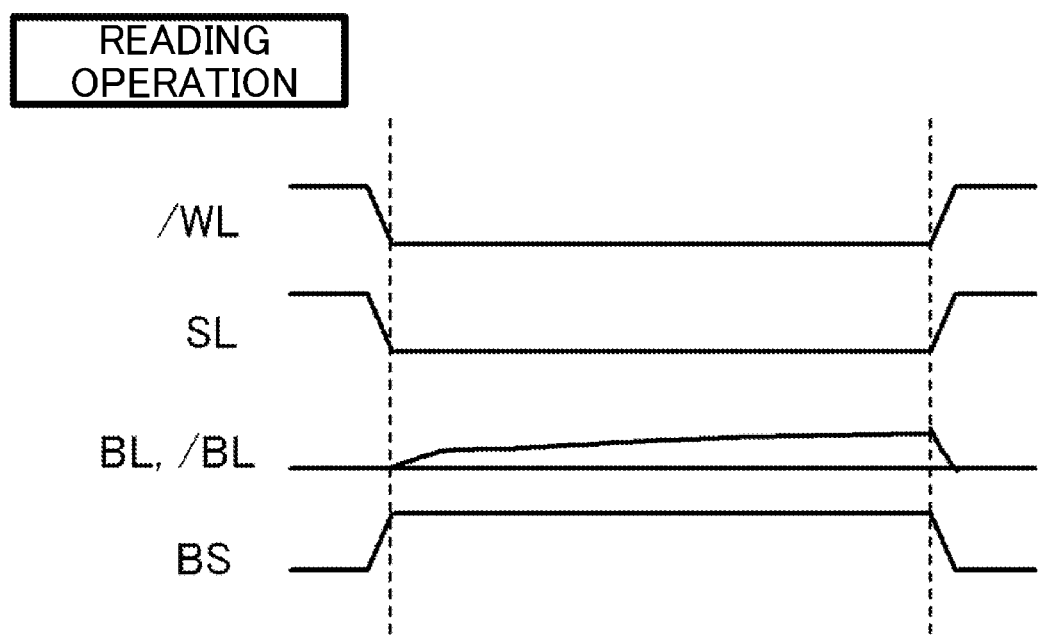
FIG. 10C is a diagram illustrating a signal waveform of each component in a reading operation.

As illustrated in FIG. 10C, the row decoder 200 sets the voltage of the word line/WL to be the low level. Hence, the P-MOSFET 15 and the P-MOSFET 25 become the ON state. In addition, the row decoder 200 sets the control line SL to be the low level. Concurrently, the column decoder 300 sets the voltage of the bit select line BS to be the high level. Hence, the N-MOSFET 34 becomes the ON state.

Accordingly, the current supplied from the power supply Vdd flows to the MTJ elements 11, 21. In this case, assuming that the MTJ element 11 is in the high resistance state $R_{AP}$ and the MTJ element 21 is in the low resistance state $R_P$, the voltage at the first connection node SN becomes lower than that of the second connection node/SN. This potential difference is amplified and stabilized by the inverters 10, 20.

The voltage at first connection node SN is transmitted to the bit line BL, while the voltage at the second connection node/SN is transmitted to the inverse bit line/BL. By detecting the potential difference between the voltage of the bit line BL and that of the inverse bit line/BL by the sensing amplifier, data stored in the memory cell 106 is read.

(Seventh Embodiment)

Figure 11A:
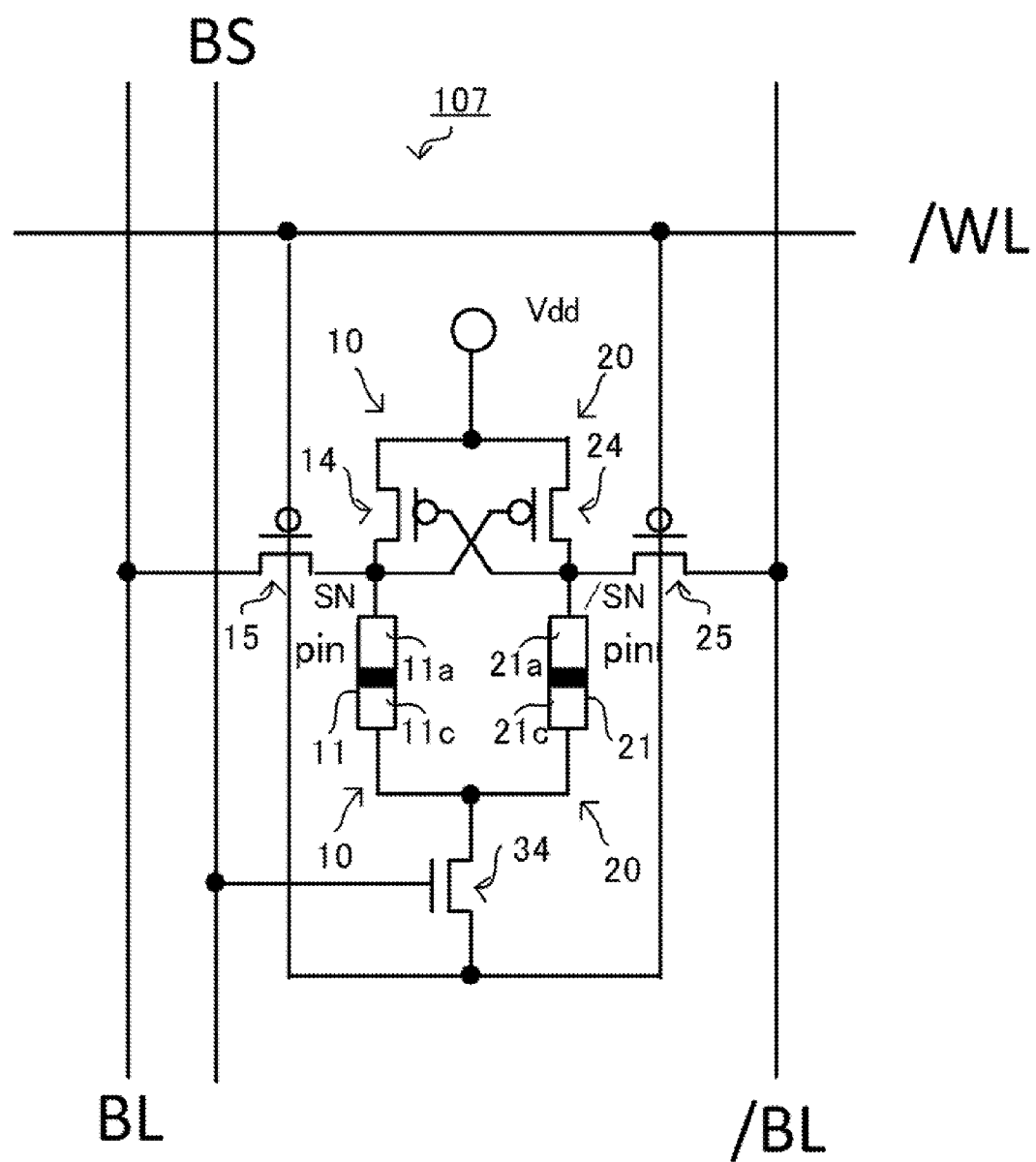
FIG. 11A is a diagram illustrating a circuit structure of a memory cell according to a seventh embodiment.
Figure 11B:
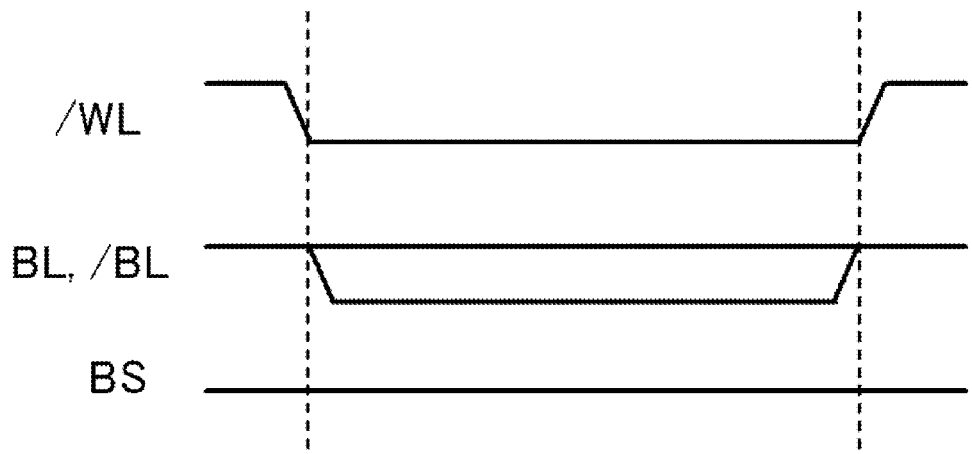
FIG. 11B is a diagram illustrating a signal waveform of each component in a writing operation.

Next, an explanation will be given of a memory cell 107 according to a seventh embodiment. FIG. 11A illustrates the circuit structure of the memory cell 107 according to the seventh embodiment. The circuit structure of the memory cell 107 is substantially the same as that of the memory cell in the sixth embodiment, but in this embodiment, the control line SL of the sixth embodiment is designed as a common line with the word line/WL, and the N-MOSFET 34 for power gating has the source connected to the word line/WL. The writing and reading operations in the seventh embodiment are basically the same as those of the sixth embodiment, FIG. 11B illustrates a waveform of a signal on each signal line at the time of writing to the memory cell 107.

At the time of writing, the low-level selection signal is output to the word line/WL from the row decoder 200. Hence, the P-MOSFET 15 and the P-MOSFET 25 become the ON status. Conversely, the column decoder 300 maintains the bit select line BS to be the low level. Hence, the N-MOSFET 34 is turned OFF.

In addition, the column decoder 300 sets, for example, the bit line BL and the inverse bit line/BL to be the high level and the low level, respectively, in accordance with data to be written. Hence, the current flows from the bit line BL to the inverse bit line/BL through the MTJ element 11 and the MTJ element 21, or in the reverse direction thereof. Accordingly, the resistance state of the MTJ element 11 and that of the MTJ element 21 are rewritten as needed.

Figure 11C:
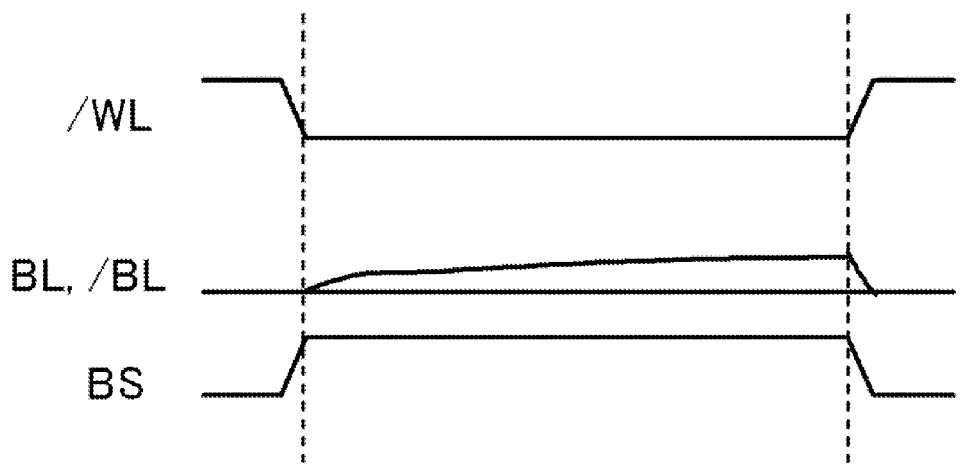
FIG. 11C is a diagram illustrating a signal waveform of each component in a reading operation.

Still further, at the time of reading, the memory cell 107 operates as follow. As illustrated in FIG. 11C, the row decoder 200 sets the voltage of the word line/WL to be the low level. Hence, the P-MOSFET 15 and the P-MOSFET 25 become the ON state. Concurrently, the column decoder 300 sets the voltage of the bit select line BS to be the high level. Hence, the N-MOSFET 34 becomes the ON state.

Accordingly, the current supplied from the power supply Vdd flows to the MTJ elements 11, 21, and the voltages in accordance with the respective resistance values of the MTJ elements 11, 21 appear on the first connection node SN and the second connection node/SN. This potential difference is amplified by the inverters 10, 20. The voltage at the first connection node SN is transmitted to the bit line BL, while the voltage at the second connection node/SN is transmitted to the inverse bit line/BL. The potential difference between the voltage of the bit line BL and that of the inverse bit line/BL is detected by the sensing amplifier. Hence, data stored in the memory cell 107 is read.

According to the seventh embodiment, since the control line SL is designed as the common line with the word line/WL, the number of wirings in the memory cell can be reduced, and thus the memory cell can be made compact.

(Eighth Embodiment)

Figure 12A:
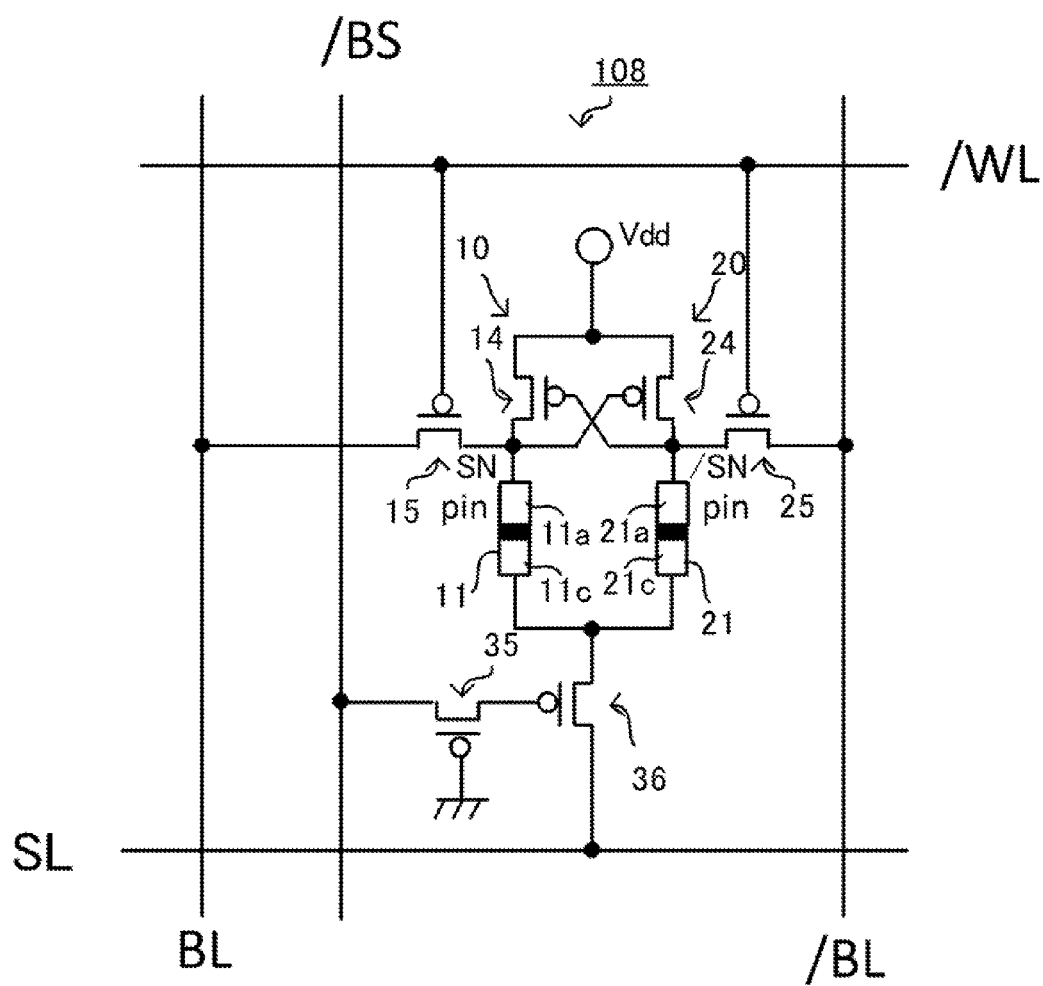
FIG. 12A is a diagram illustrating a circuit structure of a memory cell according to an eighth embodiment.

Next, an explanation will be given of a memory cell 108 according to an eighth embodiment. FIG. 12A illustrates the circuit structure of the memory cell 108 according to the eighth embodiment. The memory cell 108 includes, instead of the N-MOSFET 34 in the sixth embodiment, a P-MOSFET 36 for power gating and a P-MOSFET 35 for control.

The MTJ element 11 and the MTJ element 21 have the respective free layers 11c, 21c connected to the drain of the P-MOSFET 36. The P-MOSFET 36 has the source connected to the control line SL, and has the gate connected to the drain of the P-MOSFET 35. The P-MOSFET 35 has the grounded gate, and has the source connected to the bit select line/BS. According to such a structure, the gate potential of the P-MOSFET 36 decreases to a negative potential through the P-MOSFET 35, and when the P-MOSFET 36 becomes the ON state, the signal from the bit select line/BS is supplied to the MTJ elements 11, 21.

Figure 12B:
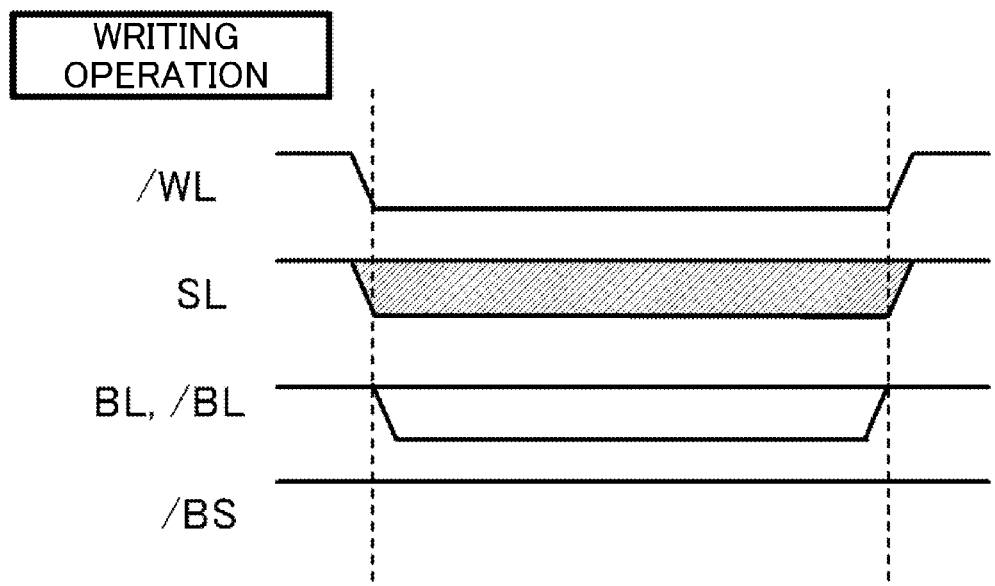
FIG. 12B is a diagram illustrating a signal waveform of each component in a writing operation.
Figure 12C:
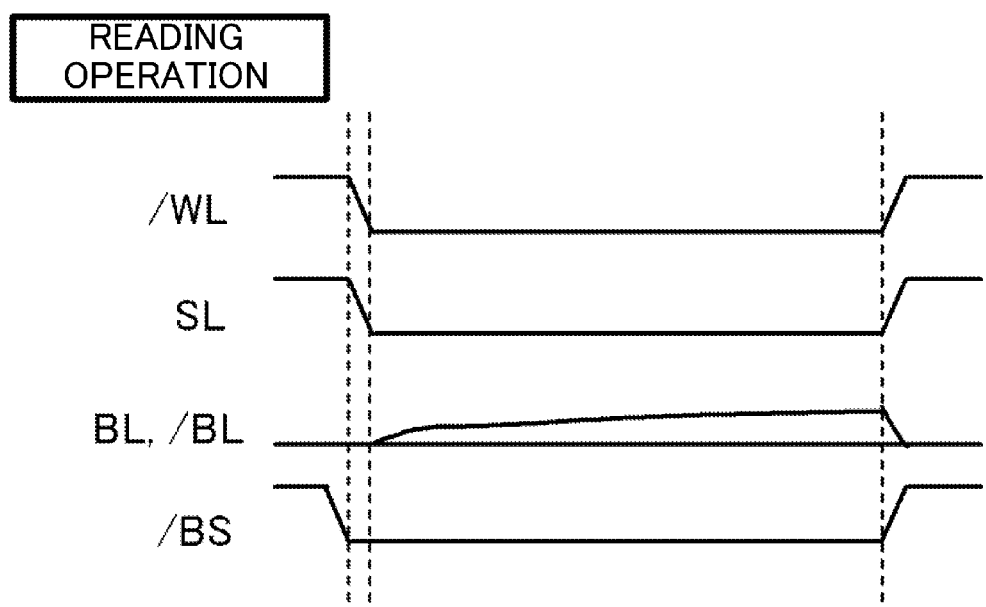
FIG. 12C is a diagram illustrating a signal waveform of each component in a reading operation.

FIGS. 12B, 12C illustrate respective signal waveforms supplied to the memory cell 108 at the time of writing and that of reading. In this embodiment, instead of the bit select line BS in the sixth embodiment, the reverse phase bit select line/BS is utilized.

At the time of writing, the row decoder 200 outputs the low-level selection signal to the word line/WL. Hence, the P-MOSFET 15 and the P-MOSFET 25 become the ON state. Conversely, the column decoder 300 maintains the bit select line/BS to be the high level. Hence, the P-MOSFET 36 that has the gate potential controlled through the P-MOSFET 35 is in the OFF state. Accordingly, no matter what voltage is applied to the control line SL, the memory cell 108 is not affected by such a voltage application.

In addition, the column decoder 300 sets the voltage of the bit line BL and that of the inverse bit line/BL in accordance with data to be written. Accordingly, the current flows from the bit line BL to the inverse bit line/BL through the MTJ element 11 and the MTJ element 21, or in the reverse direction thereof. Hence, the resistance state of the MTJ element 11 and that of the MTJ element 21 are set in accordance with the writing data.

As illustrated in FIG. 12C, at the time of reading, first, the bit select line/BS is set to be the low level, and thus the P-MOSFET 36 becomes the ON state. The row decoder 200 sets the voltage of the word line/WL to be the low level after a predetermined time has elapsed since the bit select line/BS is set to be the low level. Hence, the P-MOSFET 15 and the P-MOSFET 25 become the ON state. In addition, the row decoder 200 sets the control line SL to be the low level.

Accordingly, the current supplied from the power supply Vdd flows to the MTJ elements 11, 21, and the voltages in accordance with the respective resistance states of the MTJ elements 11, 21 appear at the first connection node SN and the second connection node/SN. This potential difference is amplified by the inverters 10, 20.

The voltage at the first connection node SN is transmitted to the bit line BL, while the voltage at the second connection node/SN is transmitted to the inverse bit line/BL. The potential difference between the voltage of the bit line BL and that of the inverse bit line/BL is detected by the sensing amplifier. Hence, data stored in the memory cell 108 is read.

Since the memory cell 108 is a circuit that has no N-MOSFET, a formation of a P-well for such an N-MOSFET on an N-type substrate is unnecessary when the memory cell is formed, or all elements can be formed in the N-well of a P-type substrate. Hence, the cell size of the memory cell 108 can be reduced in comparison with a circuit that includes both the N-MOSFET and the P-MOSFETs.

(Ninth Embodiment)

Figure 13A:
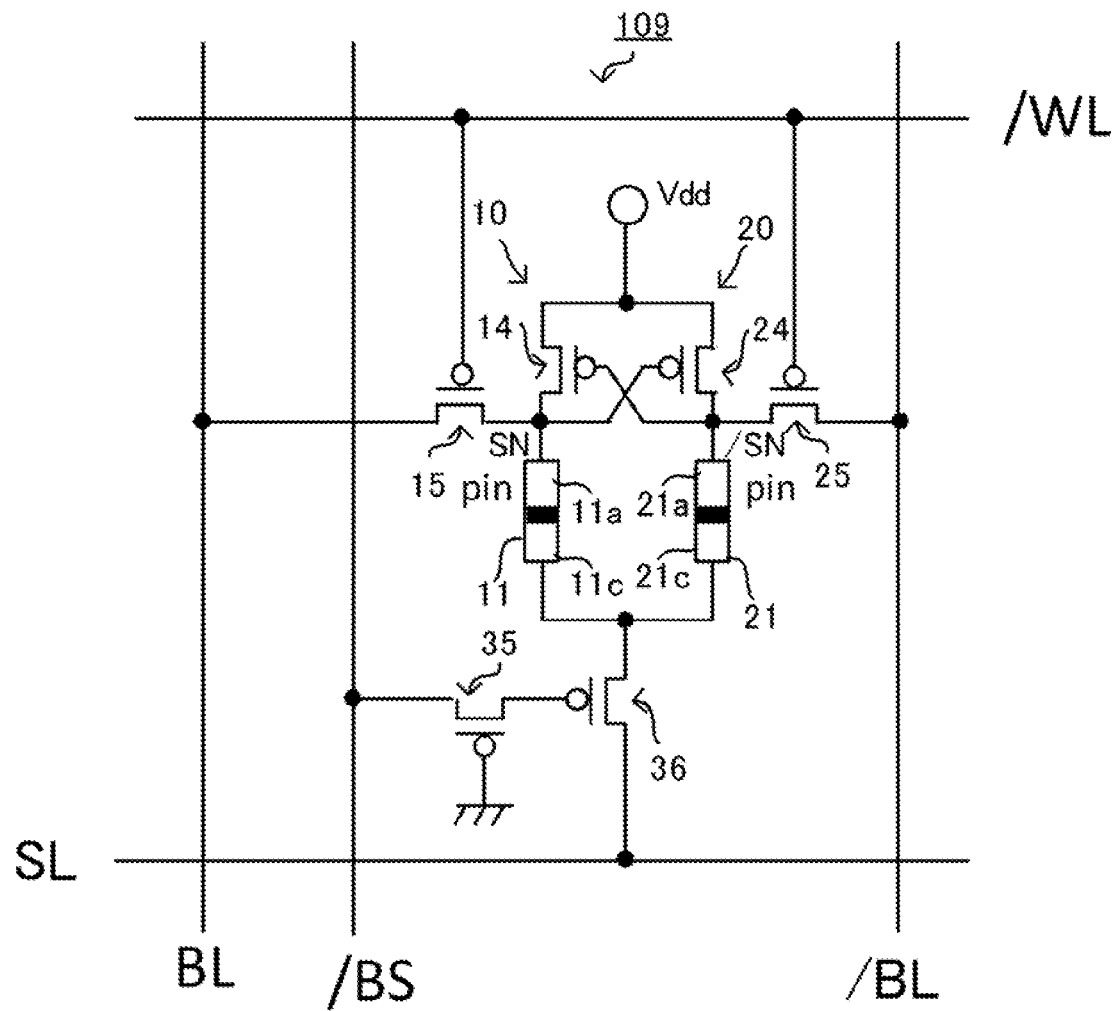
FIG. 13A is a diagram illustrating a circuit structure of a memory cell according to a ninth embodiment.

Next, a memory cell 109 according to a ninth embodiment will be explained. FIG. 13A illustrates the circuit structure of the memory cell 109 according to the ninth embodiment. The memory cell 109 employs the same circuit structure as that of the memory cell 108 in the eighth embodiment, but the writing method is different from that of the eighth embodiment.

Figure 13B:
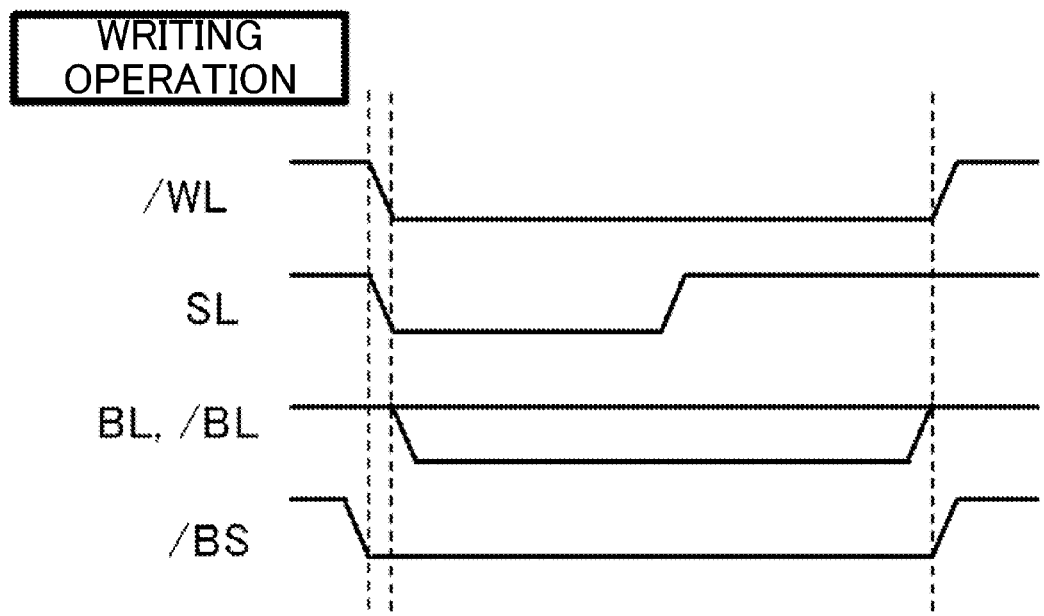
FIG. 13B is a diagram illustrating a signal waveform of each component in a writing operation.
Figure 13C:
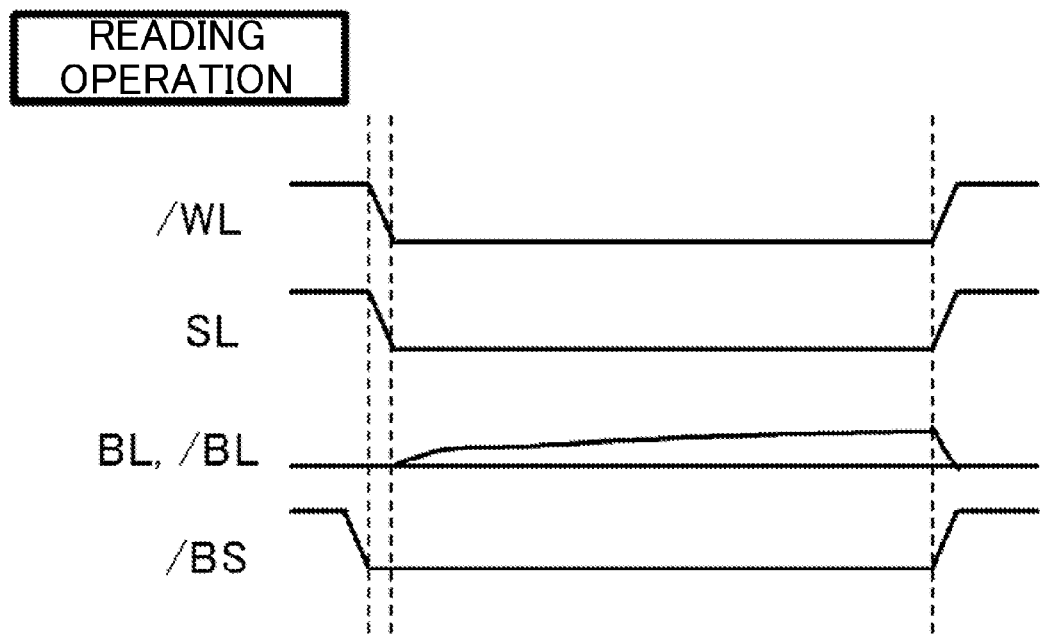
FIG. 13C is a diagram illustrating a signal waveform of each component in a reading operation.

A writing operation according to the ninth embodiment will be explained below. FIG. 13B illustrates a signal waveform on each signal line at the time of writing to the memory cell 109.

First, the bit select line/BS is set to be the low level, and the P-MOSFET 35 becomes the ON state. After a predetermined time has elapsed since the bit select line/BS is set to be the low level, the word line/WL is set to be the high level, and the P-MOSFET 15 and the P-MOSFET 25 become the ON state. The control line SL is set to be the low level simultaneously with the word line/WL, the applied voltage to the gate of the P-MOSFET 36 becomes a negative potential, and thus the P-MOSFET 36 becomes the ON state.

The first connection node SN and the second connection node/SN are set to be the high level and the low level, respectively, through the P-MOSFETs 15, 25 connected to the bit line Bl and the inverse bit line/BL, respectively. When the control line SL at the first half cycle is the low level, the current flows from the first connection node SN to the control line SL through the MTJ element 21. When the MTJ element 21 is the low resistance state $R_P$, the amount of current exceeds a threshold, and thus the MTJ element 21 transitions to the high resistance state $R_{AP}$. Conversely, no current flows through the MTJ element 11, and thus the resistance state of the MTJ element 11 remains unchanged.

In addition, at the second half cycle, the row decoder 200 sets the control line SL to be the high level, and the current flows from the second connection node/SN to the control line SL through the MTJ element 11. When the MTJ element 11 is the low resistance state $R_P$, the amount of current exceeds a threshold, and thus the MTJ element 11 transitions to the high resistance state $R_{AP}$. Conversely, no current flows through the MTJ element 21, and thus the resistance state of the MTJ element 21 remains unchanged. Hence, writing is performed on the memory cell 109 in this way.

The reading operation of the memory cell 109 is basically the same as that of the eighth embodiment. Hence, the explanation thereof will be omitted in this embodiment. The memory cell 109 operates as explained above according to the ninth embodiment.

(10th Embodiment)

Figure 14A:
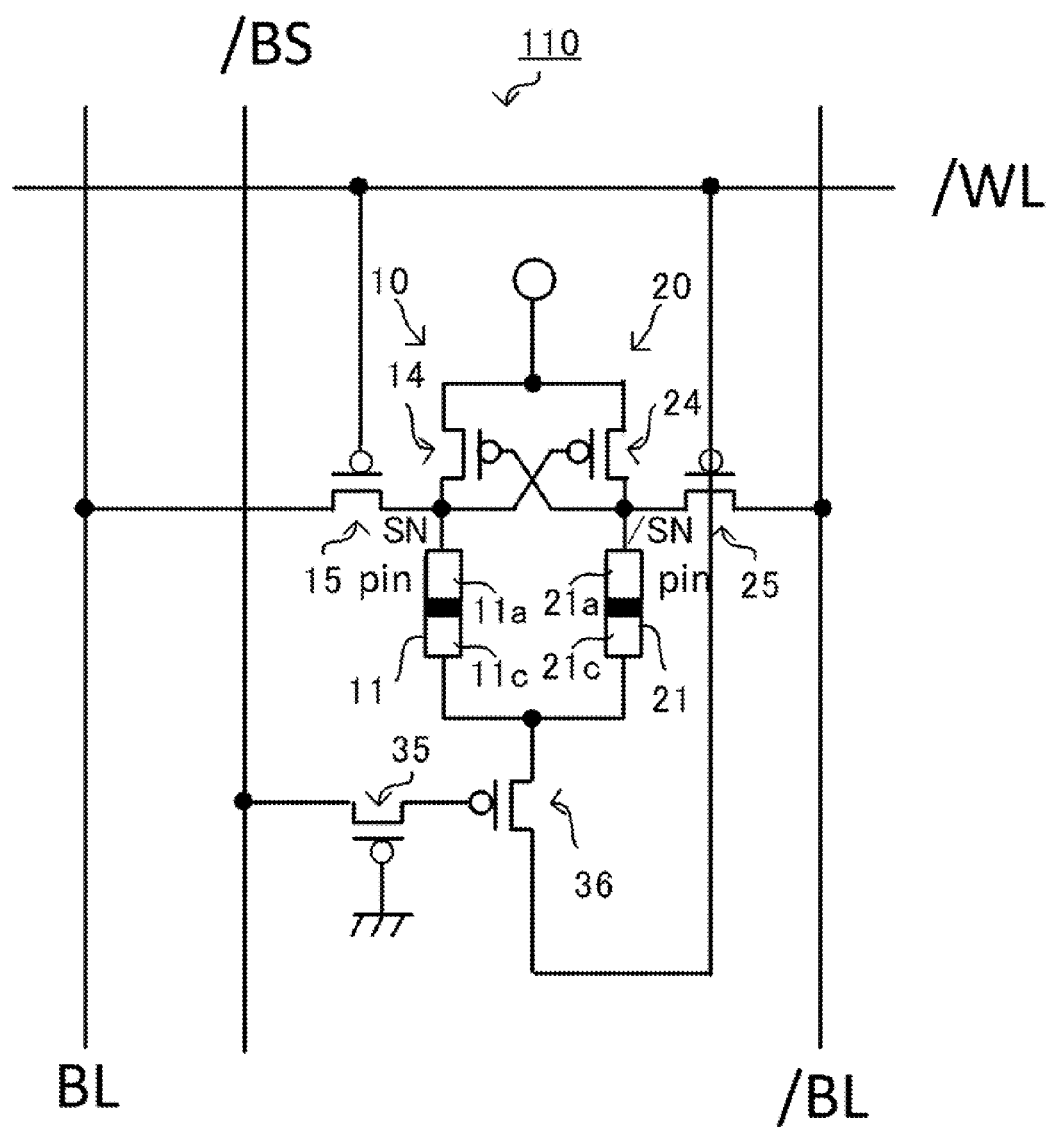
FIG. 14A is a diagram illustrating a circuit structure of a memory cell according to a 10th embodiment.
Figure 14B:
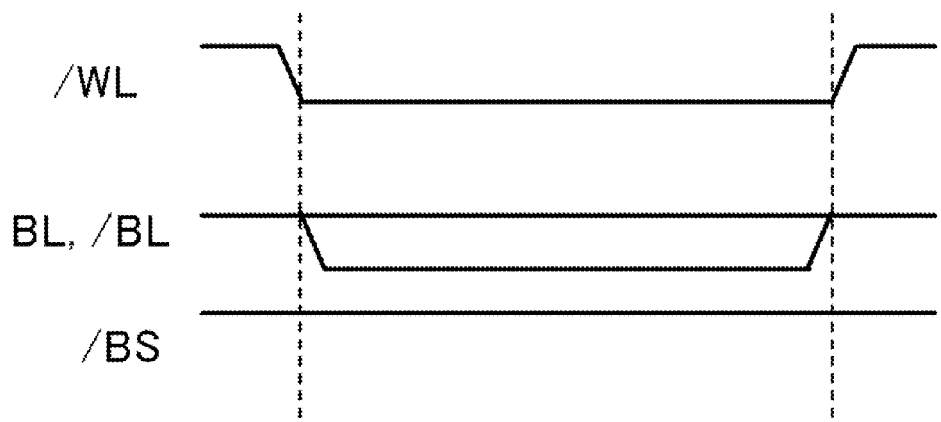
FIG. 14B is a diagram illustrating a signal waveform of each component in a writing operation.
Figure 14C:
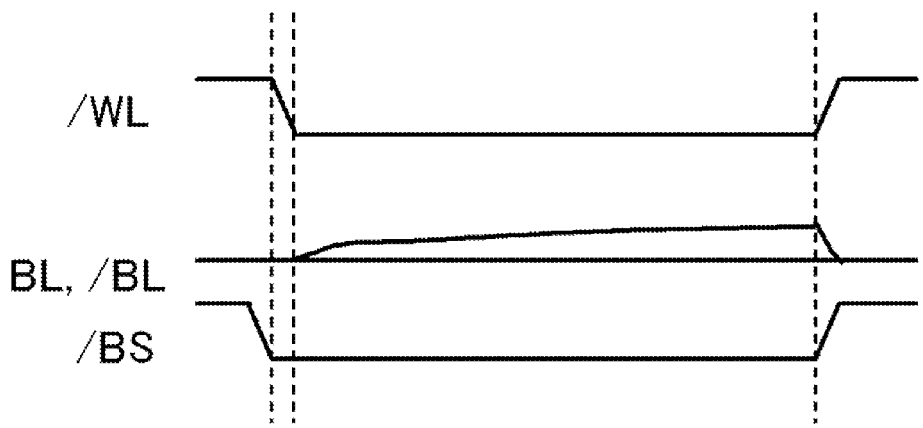
FIG. 14C is a diagram illustrating a signal waveform of each component in a reading operation.

Next, an explanation will be given of a memory cell 110 according to a 10th embodiment. FIG. 14A illustrates the circuit structure of the memory cell 110 according to the 10th embodiment. The memory cell 110 employs the same circuit structure as that of the memory cell 108 in the eighth embodiment, but in this embodiment, the control line SL utilized in the eighth embodiment is designed as a common line with the word line/WL, and the P-MOSFET 36 for power gating has the source connected to the word line/WL.

The writing and reading operations of the memory cell 110 are basically the same as those of the eighth embodiment. Hence, the explanation thereof will be omitted in this embodiment. In the 10th embodiment, the select line PL is designed as a common line with the word line/WL, the number of wirings in the memory cell can be reduced, and thus the memory cell can be made compact.

The explanation has been given of an example circuit that is a 4T2MTJ cell on the basis of four transistors and two MTJ elements in the first to 10th embodiments, but an explanation will be given below of an example circuit structure that is a 6T2MTJ cell including six transistors and two MTJ elements.

(11th Embodiment)

Figure 15A:
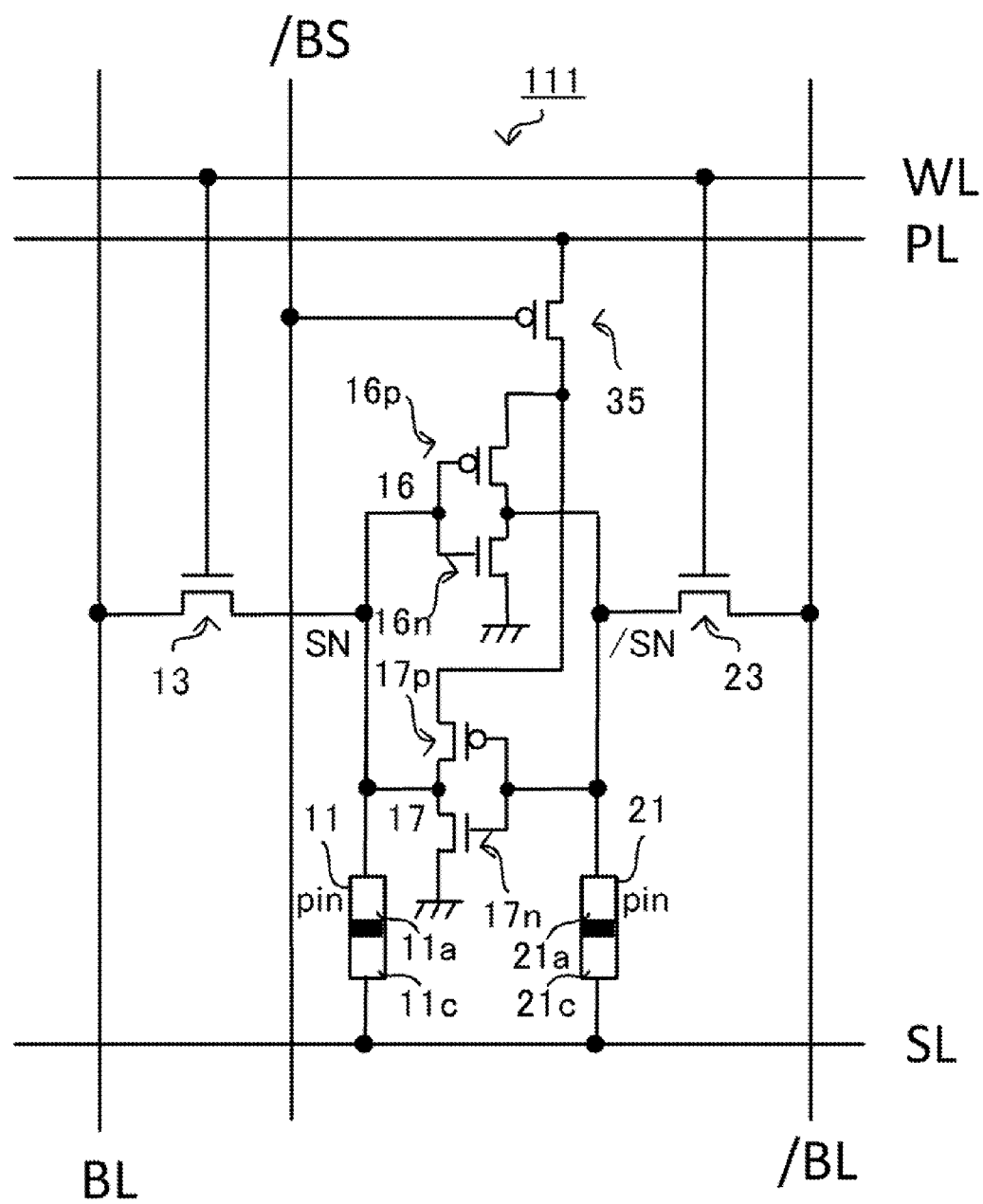
FIG. 15A is a diagram illustrating a circuit structure of a memory cell according to an 11th embodiment.

FIG. 15A illustrates the circuit structure of a memory cell 111 according to an 11th embodiment. The memory cell 111 includes a flip-flop circuit which has two inverters including an MTJ element and a CMOS circuit for driving the MTJ element. A CMOS inverter 16 including a P-MOSFET 16p and an N-MOSFET 16n, and, a CMOS inverter 17 including a P-MOSFET 17a and an N-MOSFET 17n form a loop circuit.

The CMOS inverter 17 has an output terminal that is the first connection node SN, and the CMOS inverter 16 has an output terminal that is the second connection node/SN.

The N-MOSFET 13 that is a transfer gate has the drain connected to the first connection node SN, and has the source connected to the bit line BL. The N-MOSFET 23 has the drain connected to the second connection node/SN, and has the source connected to the bit line/BL. The N-MOSFET 13 and the N-MOSFET 23 have the respective gates connected to the word line WL.

The CMOS inverter 17 has an output terminal connected to the pin layer 11a of the MTJ element 11. The MTJ element 11 has the free layer 11c connected to the control line SL. The CMOS inverter 16 has an output terminal connected to the pin layer 21a of the MTJ element 21. The MTJ element 21 has the free layer 21c connected to the control line SL.

In this embodiment, the memory cell 111 includes a P-MOSFET 35 that is a transistor for power gating. The P-MOSFET 35 has the source connected to the power line PL, and has the gate connected to the bit select line/BS. The P-MOSFET 35 has the drain connected to respective power-supply voltage terminals of the CMOS inverter 16 and the CMOS inverter 17.

Hence, with power being supplied from the power line PL, when a low-level signal is input from the bit select line/BS, a high-level signal is supplied from the power line PL to the power-supply voltage terminals of the CMOS inverters 16, 17.

Figure 15B:
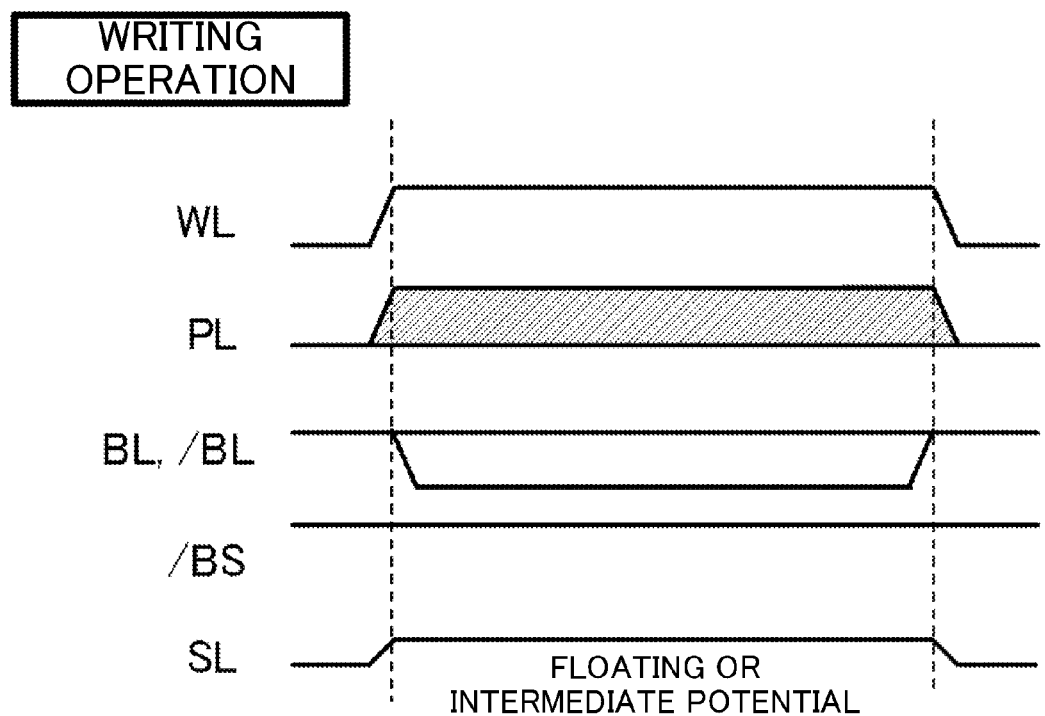
FIG. 15B is a diagram illustrating a signal waveform of each component in a writing operation.

Next, an explanation will be given of a writing operation of the memory cell 111, FIG. 15B illustrates a signal waveform on each signal line at the time of writing to the memory cell 111.

At the time of writing, the word line WL is set to be the high level. Hence, the N-MOSFET 13 and the N-MOSFET 23 become the ON state. At this time, since the bit select line/BS is maintained at the high level, the P-MOSFET 35 is turned OFF. Accordingly, no matter what signal is input from the power line PL, the memory cell 111 is not affected by such an input signal.

In addition, the voltage of the bit line BL and that of the inverse bit line/BL are set to be voltages in accordance with data to be written. In this case, assuming that the bit line BL and the inverse bit line/BL are set to be the high level and the low level, respectively, since the control line SL is set to be an intermediate potential (or a floating state), the current from the bit line BL flows, through the N-MOSFET 13, in a direction from the pin layer 11a of the MTJ element 11 to the free layer 11c. The current that has passed through the MTJ element 11 flows from the free layer 21c of the MTJ element 21 to the pin layer 21a through the control line SL, and flows to the bit line/BL through the N-MOSFET 23.

Since the current flows from the pin layer 11a of the MTJ element 11 to the free layer 11c, when the MTJ element 11 is in the low resistance state $R_P$, the MTJ element 11 transitions to the high resistance state $R_{AP}$. That is, the MTJ element 11 is rewritten. Conversely, when the MTJ element 11 is in the high resistance state $R_{AP}$, the resistance state of the MTJ element 11 remains unchanged.

In addition, as for the MTJ element 21, since the current flows from the free layer 21c to the pin layer 21a, when the MTJ element 21 is in the high resistance state $R_{AP}$, the MTJ element 21 transitions to the low resistance state $R_P$. That is, the MTJ element 21 is rewritten. Conversely, when the MTJ element 21 is in the low resistance state $R_P$, the resistance state of the MTJ element 21 remains unchanged.

According to this embodiment, also, since the MTJ elements 11, 21 are laid out in series so as to have different directions of the pin layer 11a and the free layer 11c relative to the current path, the MTJ elements 11, 21 can be rewritten simultaneously.

Figure 15C:
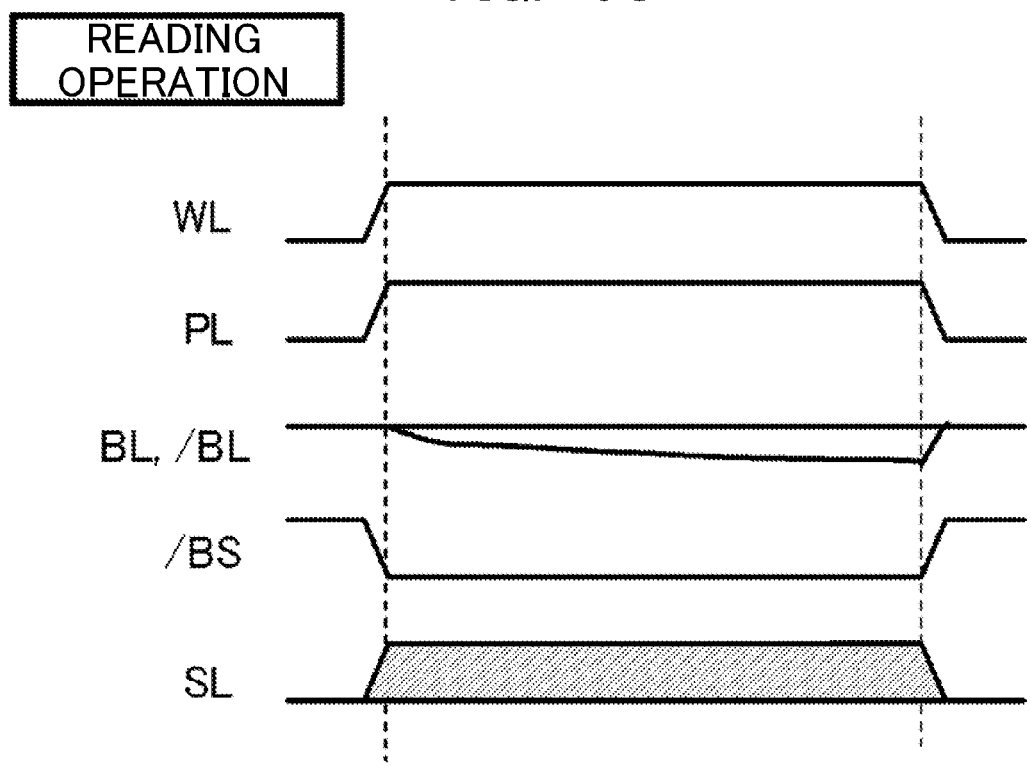
FIG. 15C is a diagram illustrating a signal waveform of each component in a reading operation.

In addition, as illustrated in FIG. 15C, at the time of reading, the word line WL is set to be the high level, and thus the N-MOSFET 13, and the N-MOSFET 23 become the ON state. When the MTJ element 11 is in the high resistance state $R_{AP}$ and the MTJ element 21 is in the low resistance state $R_P$, the first connection node SN and the second connection node/SN are set to be the high level and the low level, respectively. Hence, when the control line SL is in the floating state, the current flows from the first connection node SN to the control line SL through the MTJ element 11. At this time, the current flows from the pin layer 11a to the free layer 11c. The current that has passed through the MTJ element 11 flows to the control line SL.

In addition, simultaneously with the word line WL becoming the high level, the bit select line/BS and the power line PL are set to be the low level and the high level, respectively. Hence, the P-MOSFET 35 becomes the ON state.

Since the P-MOSFET 35 becomes the ON state, the high-level voltage of the power line PL is applied to the CMOS inverters 16, 17. In addition, the current flows to the control line SL through the MTJ element 21. At this time, the current flows from the pin layer 11a to the free layer 11c. Still further, between the bit line BL and the inverse bit line/BL both pre-charged to the high level, the current flows from the inverse bit line/BL to the ground through the N-MOSFET 16n.

Hence, the voltage of the bit line BL and that of the inverse bit line/BL gradually change. By amplifying the voltage difference by the sensing amplifier and determining the amplified voltage difference, data stored in the memory cell 111 is read.

Note that at the time of reading, the control line SL can have any potential.

(12th Embodiment)

In the 11th embodiment, as illustrated in FIG. 15B, and FIG. 15C, the applied voltage to the power line PL can be any voltage at the time of writing, and the word line WL and the power line PL have the same voltage waveform at the time of reading. Hence, an explanation will be given below of an example structure in which the word line WL and the power line PL are designed as a common line.

Figure 16A:
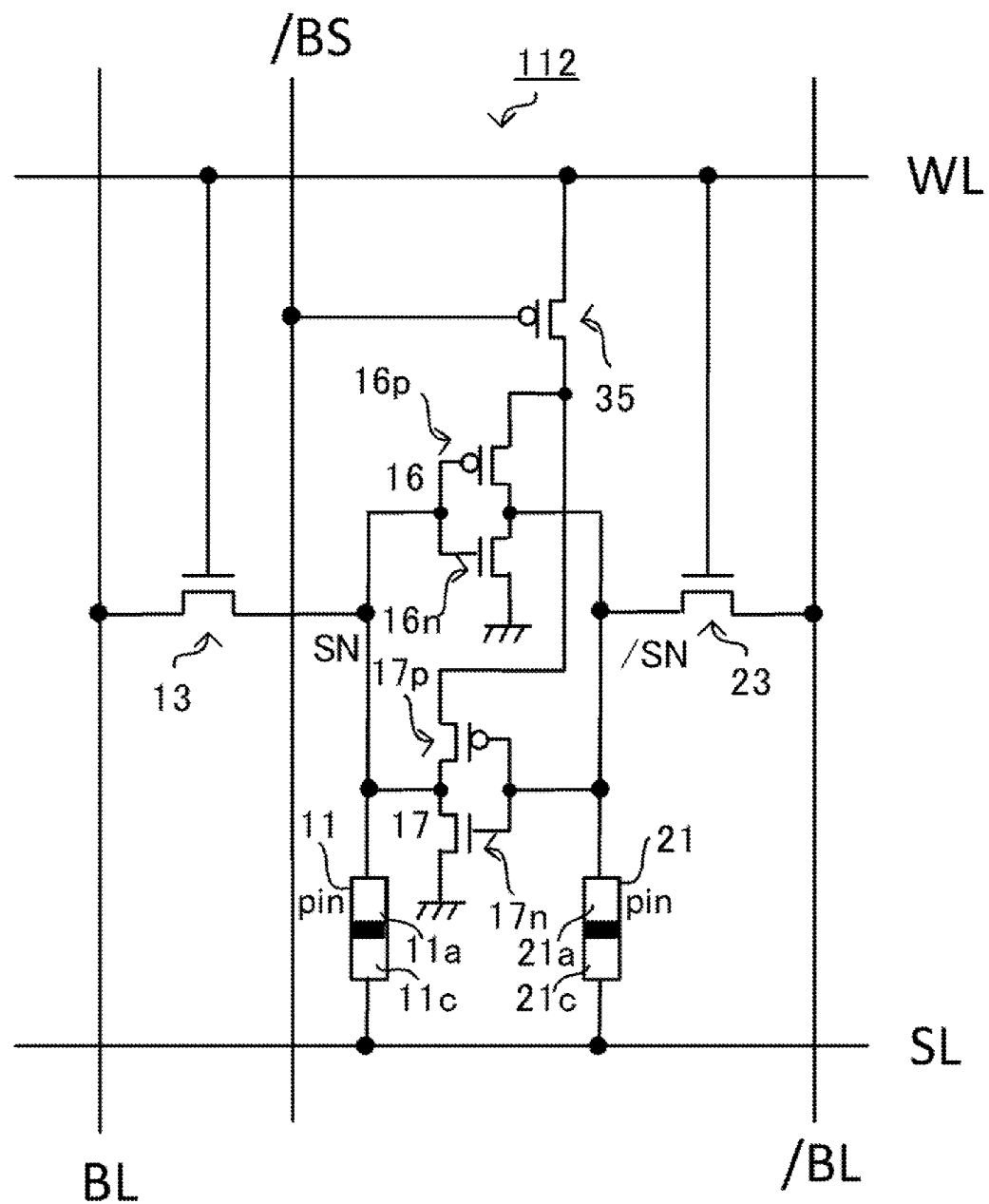
FIG. 16A is a diagram illustrating a circuit structure of a memory cell according to a 12th embodiment.
Figure 16B:
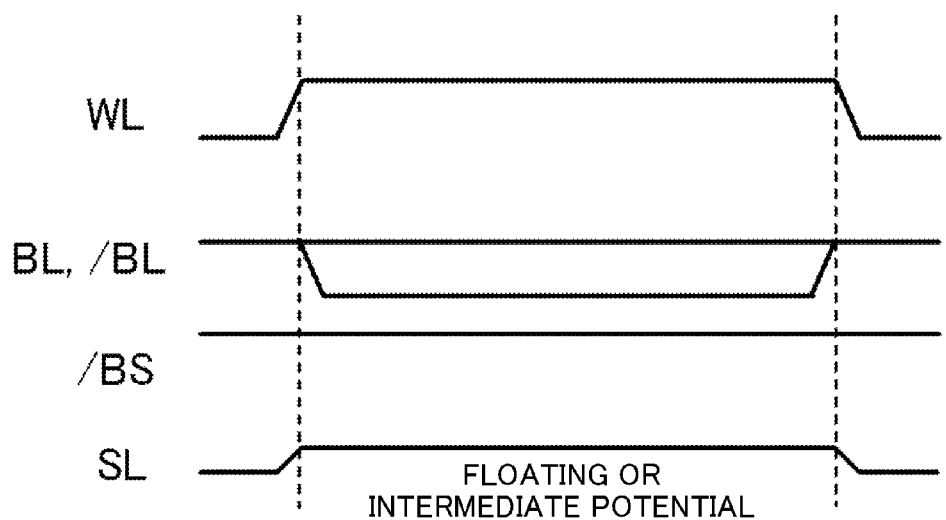
FIG. 16B is a diagram illustrating a signal waveform of each component in a writing operation.
Figure 16C:
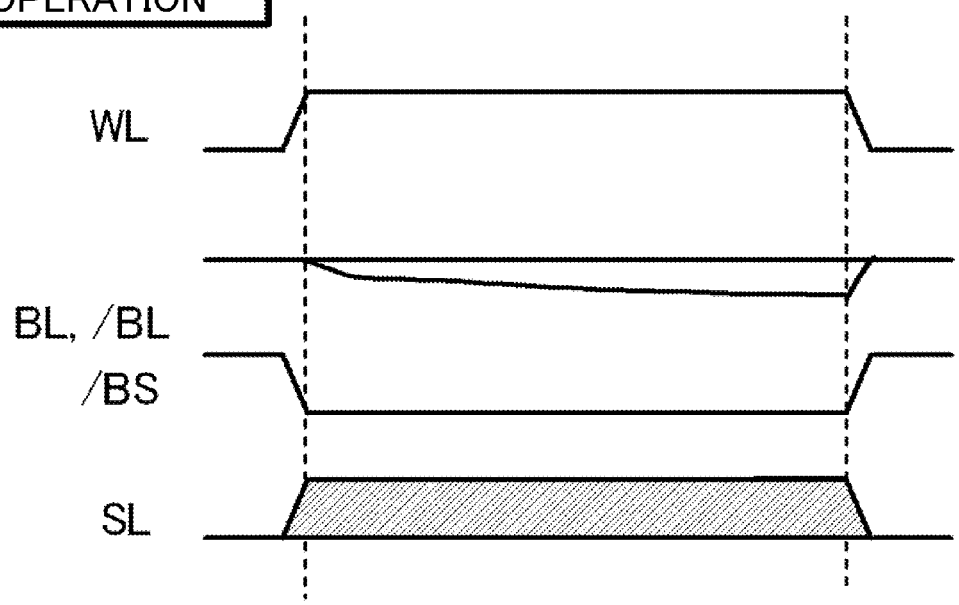
FIG. 16C is a diagram illustrating a signal waveform of each component in a reading operation.

FIG. 16A illustrates a circuit structure of a memory cell 112 according to a 12th embodiment. FIG. 16B illustrates a signal waveform at the time of writing. FIG. 16C illustrates a signal waveform at the time of reading. The memory cell 112 according to the 12th embodiment employs basically the same structure as that of the memory cell in the 11th embodiment, but in this embodiment, the power line PL and the word line WL utilized in the 11th embodiment are designed as a common line, and the current is supplied from the word line WL to the source of the P-MOSFET 31.

The writing and reading operations in the 12th embodiment are basically the same as those of the 11th embodiment, and thus the explanation thereof will be omitted in this embodiment. In the 12th embodiment, since the power line PL and the word line WL are designed as a common line, the number of wirings in the memory cell can be reduced, and the memory cell can be made compact.

(13th Embodiment)

In the above 11th and 12th embodiments, at the time of writing, the current is supplied to the closed-loop current path that includes the MTJ elements 11, 21, and simultaneous writing is performed on the MTJ elements 11, 21. However, the writing method is not limited to this example, and the following method is also applicable.

Figure 17A:
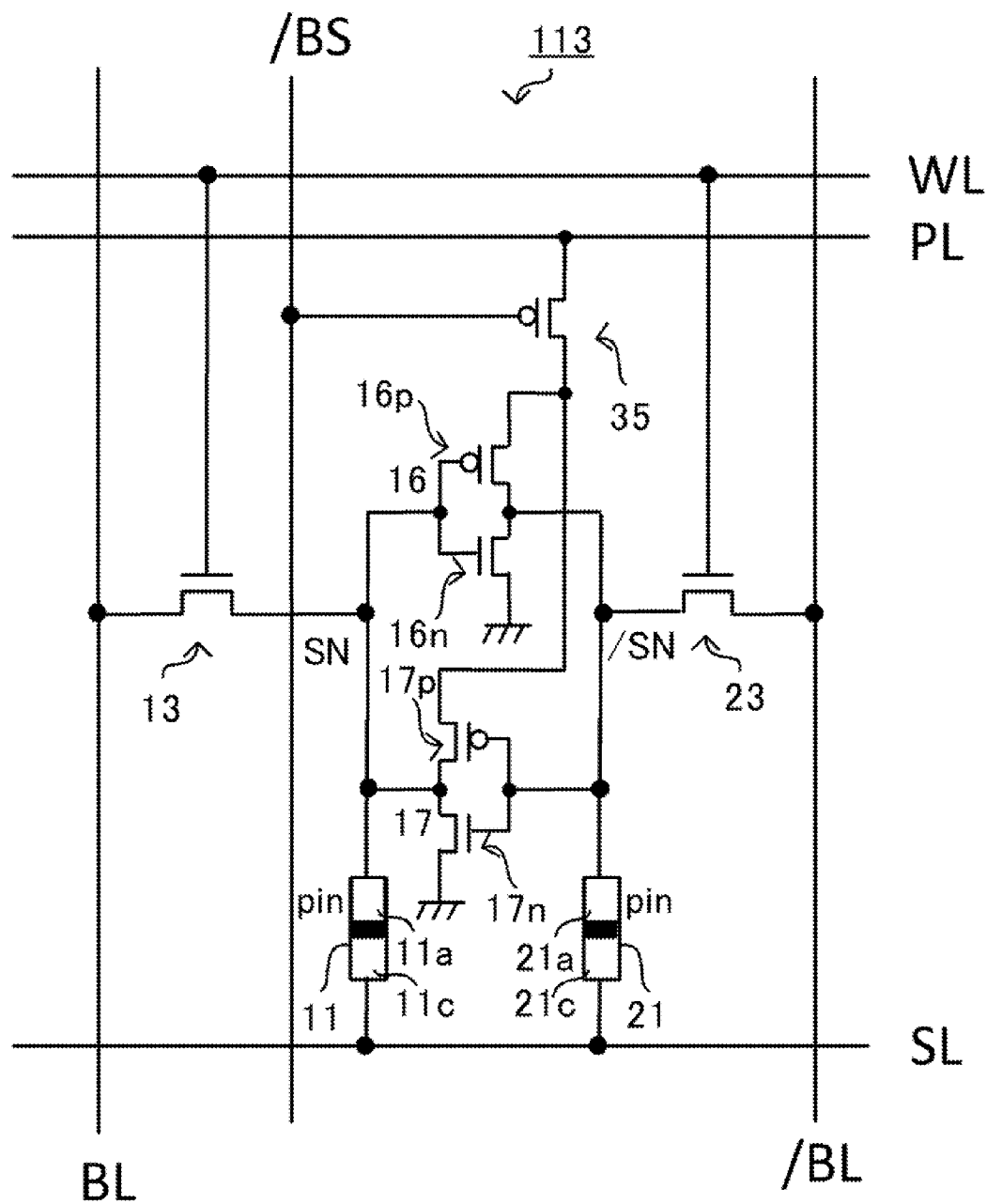
FIG. 17A is a diagram illustrating a circuit structure of a memory cell according to a 13th embodiment.

FIG. 17A illustrates the circuit structure of the memory cell 113 according to the 13th embodiment. The memory cell 113 employs the same circuit structure as that of the memory cell 111 in the 11th embodiment.

Figure 17B:
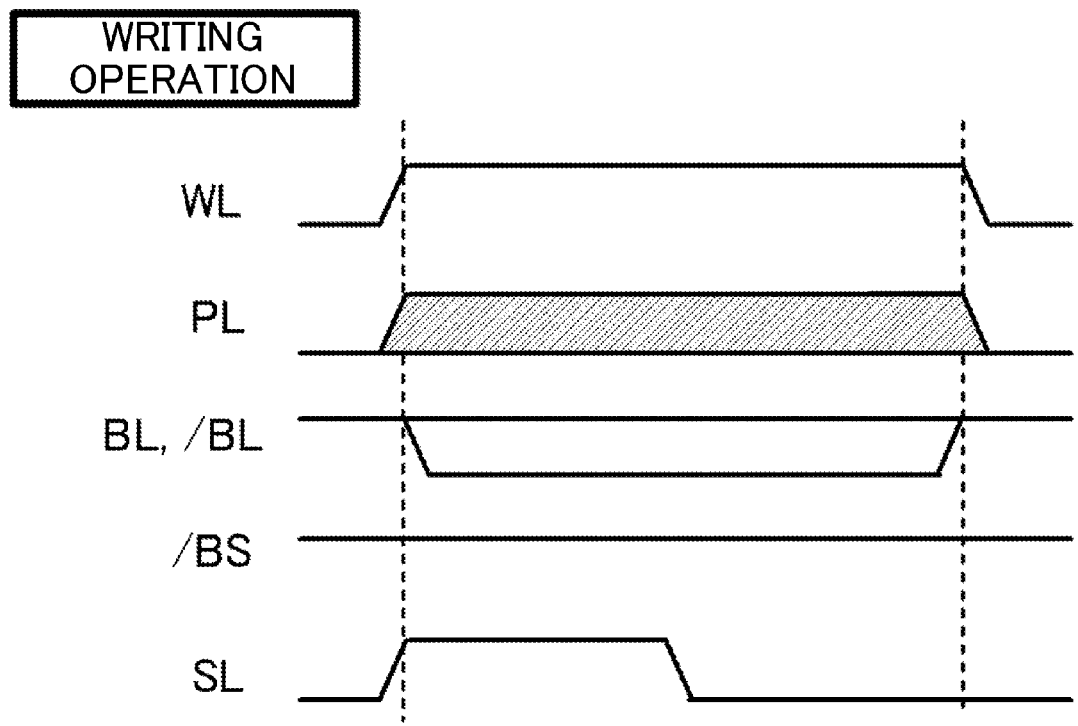
FIG. 17B is a diagram illustrating a signal waveform of each component in a writing operation.
Figure 17C:
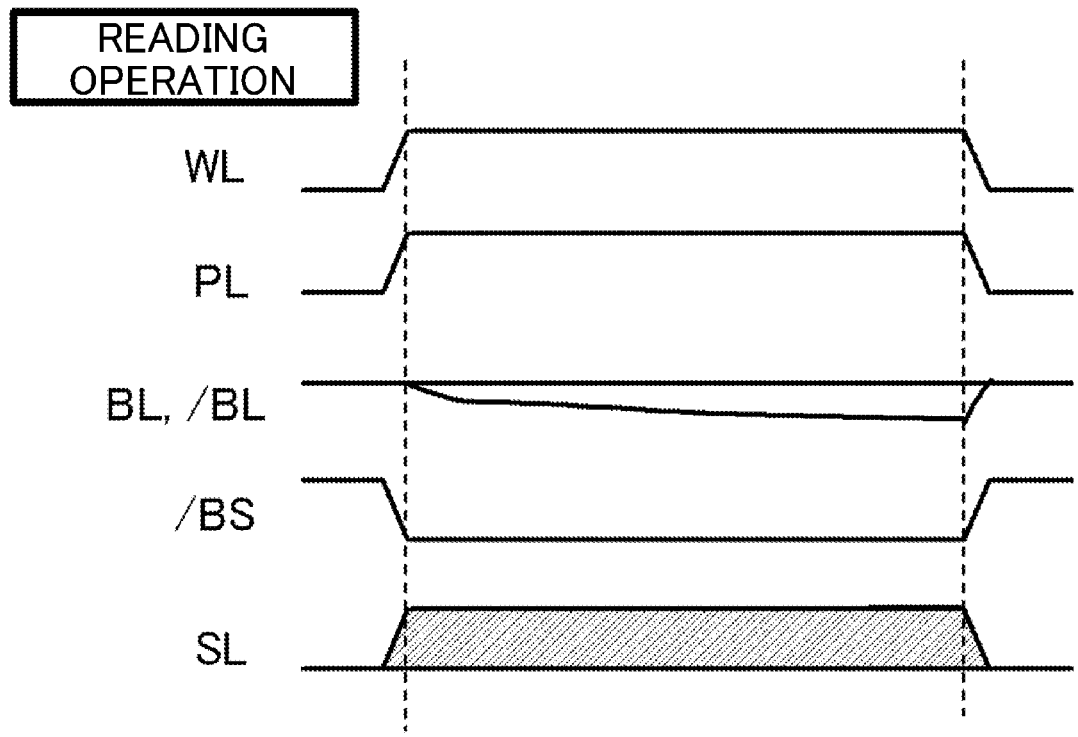
FIG. 17C is a diagram illustrating a signal waveform of each component in a reading operation.

FIG. 17B illustrates a signal waveform on each signal line at the time of writing to the memory cell 113. Since the bit select line/BS is set to be the high level, the P-MOSFET 35 becomes the OFF state. Since the word line WL is set to be the high level, the N-MOSFET 13 and the N-MOSFET 23 become the ON state.

The first connection node SN and the second connection node/SN are set to be the high level or low level via the N-MOSFETs 13, 23 connected to the bit line BL and the bit line/BL, respectively. When the control line SL in the first half cycle is high level, the current flows from the control line SL to the second connection node/SN through the MTJ element 21. When the MTJ element 21 is in the high resistance state $R_{AP}$, and when the amount of current exceeds the threshold, the MTJ element 21 transitions to the low resistance state $R_P$. Conversely, no current flows through the MTJ element 11, and thus the resistance state of the MTJ element 11 remains unchanged.

In addition, in the second half cycle, the control line SL is set to be the low level, and the current flows from the first connection node SN to the control line SL via the MTJ element 11. When the MTJ element 11 is in the low resistance state $R_P$, the amount of current exceeds the threshold, and thus the MTJ element 11 transitions to the high resistance state $R_{AP}$. Conversely, no current flows through the MTJ element 21, and thus the resistance state of the MTJ element 21 remains unchanged. Hence, writing is performed on the memory cell 113 in this way.

The reading operation of the memory cell 113 is basically the same as that of the 11th embodiment. Hence, the explanation thereof will be omitted in this embodiment. The operations explained above are the operations of the memory cell 113 in the 13th embodiment.

(14th Embodiment)

The above writing method is also applicable to a circuit that has the word line WL and the power line PL designed as a common line.

Figure 18A:
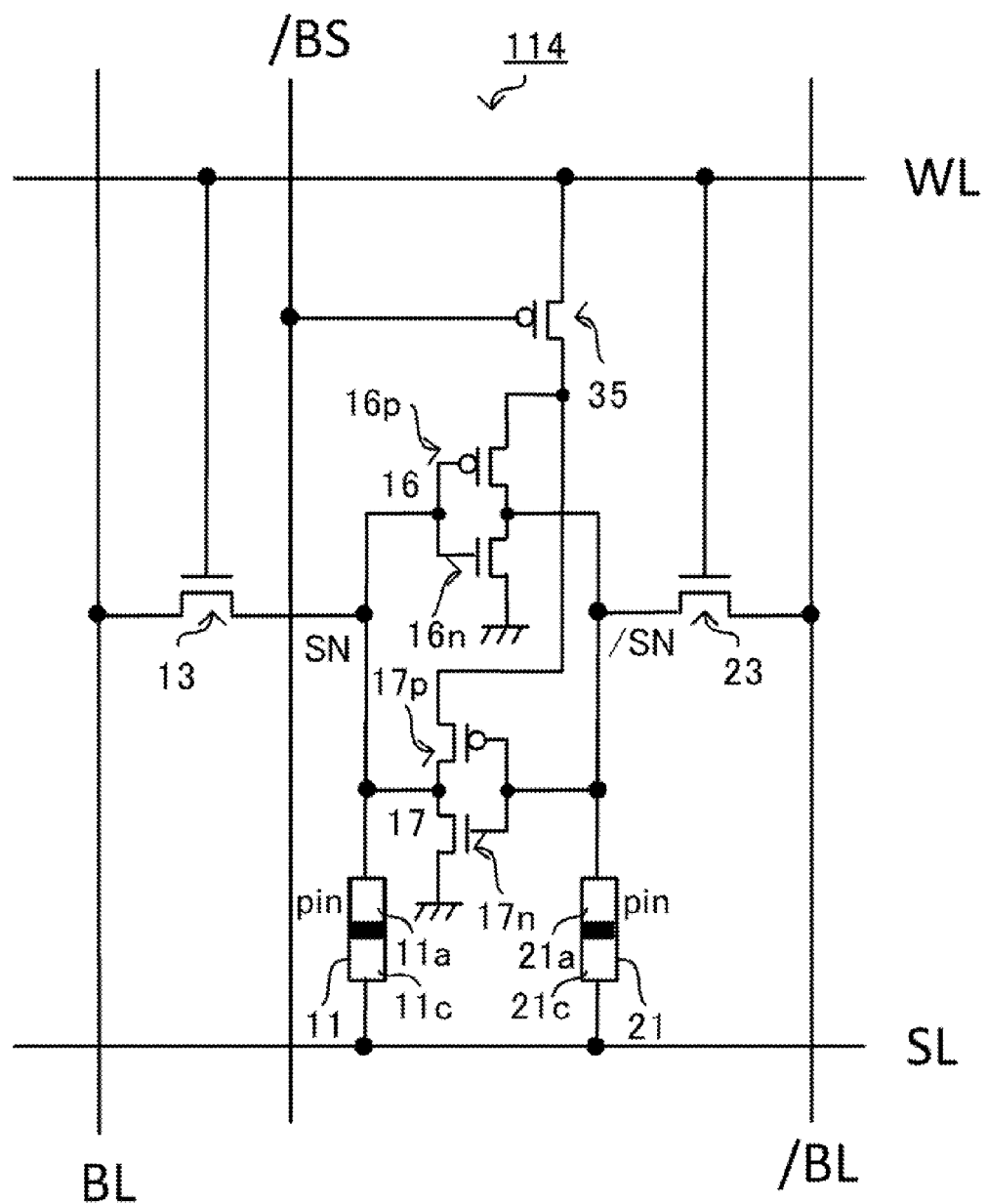
FIG. 18A is a diagram illustrating a circuit structure of a memory cell according to a 14th embodiment.
Figure 18B:
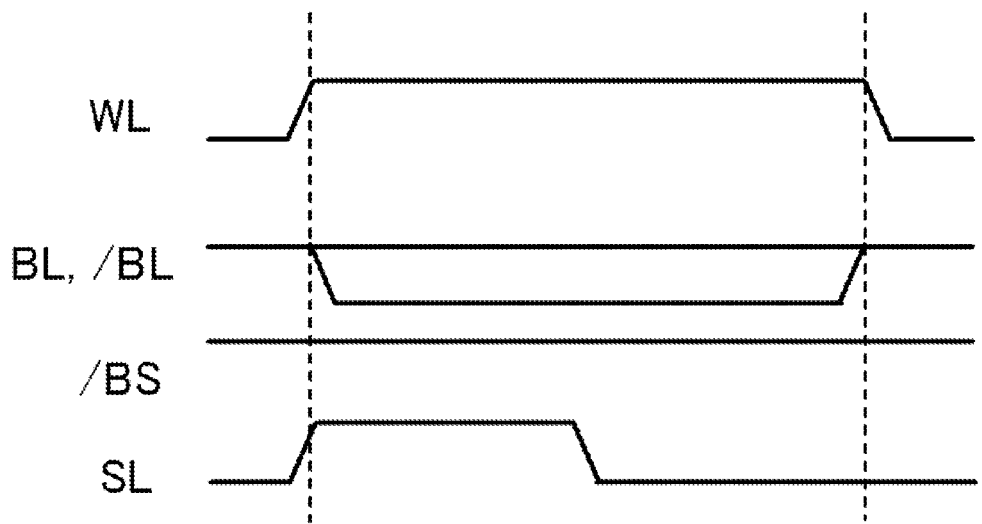
FIG. 18B is a diagram illustrating a signal waveform of each component in a writing operation.
Figure 18C:
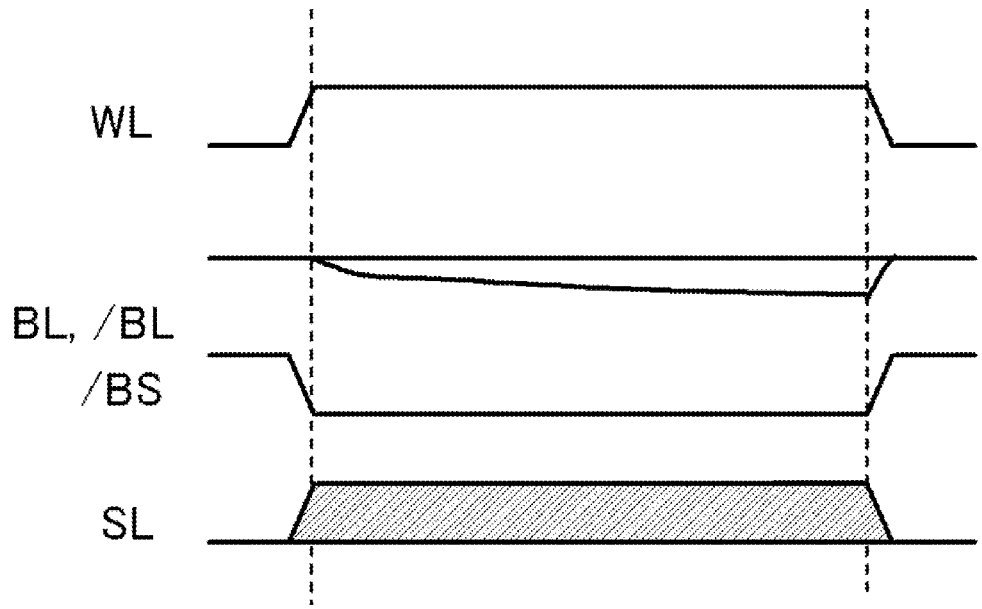
FIG. 18C is a diagram illustrating a signal waveform of each component in a reading operation.

FIG. 18A illustrates the circuit structure of a memory cell 114 according to a 14th embodiment. The memory cell 114 employs the same circuit structure as that of the memory cell 112 in the 12th embodiment. As illustrated in FIG. 18B, at the time of writing, the control line SL is set to be the high level in the first half cycle, and the control line SL is set to be the low level in the second half cycle. The operation of the memory cell 114 at the time of writing is the same as that of the 13th embodiment. Hence, the explanation thereof will be omitted in this embodiment, In addition, the operation at the time of reading is basically the same as that of the 12th embodiment, and thus the explanation thereof will be omitted in this embodiment.

(15th Embodiment)

The memory cells according to the 11th to 14 embodiments each include the P-MOSFET that is a transistor for power gating, but an N-MOSFET is also applicable as the transistor for power gating.

Figure 19A:
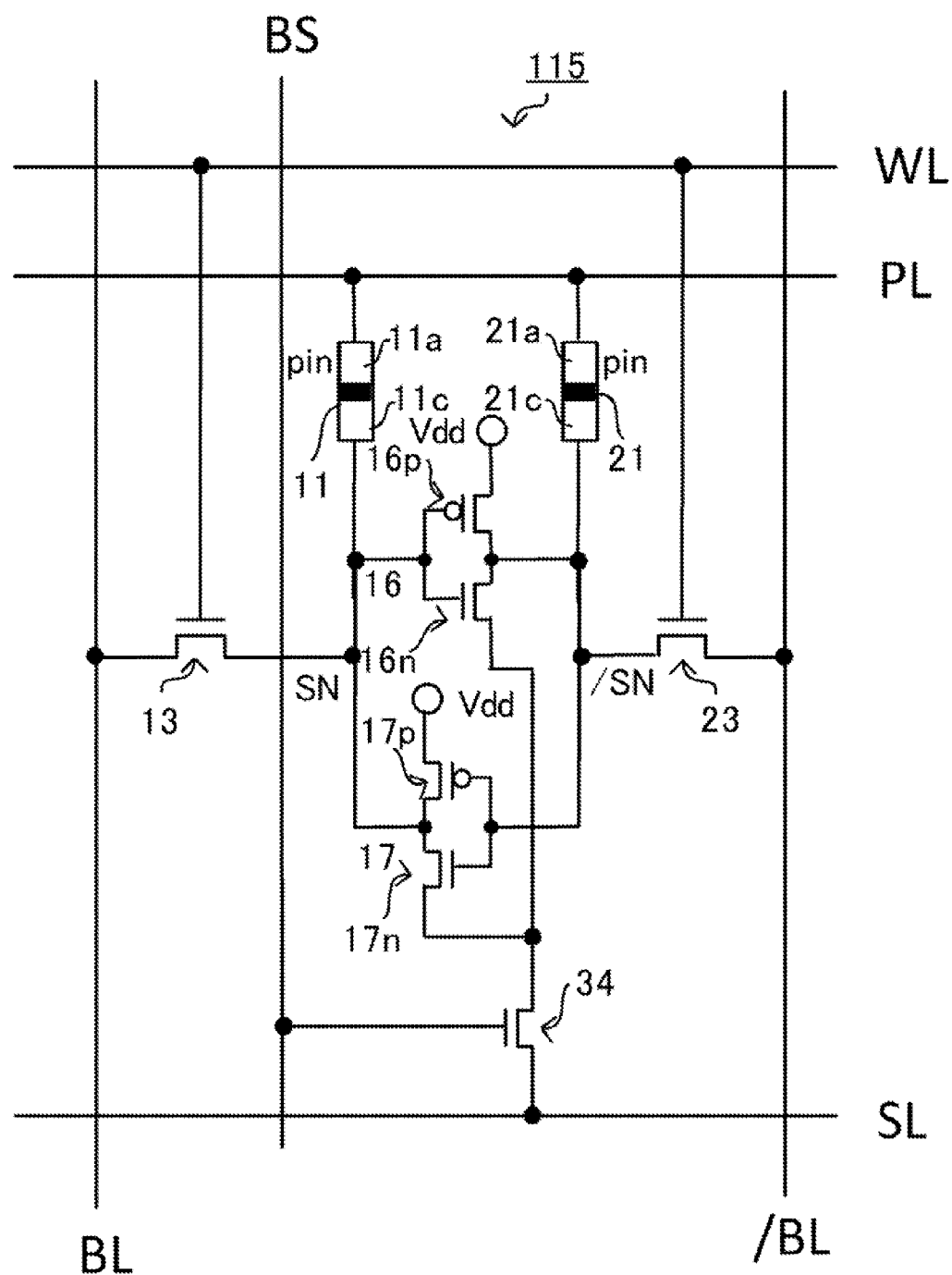
FIG. 19A is a diagram illustrating a circuit structure of a memory cell according to a 15th embodiment.

FIG. 19A illustrates the circuit structure of a memory cell 115 according to a 15th embodiment. The memory cell 115 employs substantially the same circuit structure as that of the memory cell 111 in the 11th embodiment, but includes, instead of the P-MOSFET 35, an N-MOSFET 34 for power gating.

An explanation will be given below of mainly the difference from the memory cell 111 in the 11th embodiment.

The CMOS inverter 16 has the output terminal (second connection node/SN) connected to the free layer 21c of the MTJ element 21. The MTJ element 21 has the pin layer 21a connected to the power line PL. The CMOS inverter 17 has the output terminal (first connection node SN) connected to the free layer 11c of the MTJ element 11. The MTJ element 11 has the pin layer 11a connected to the power line PL. That is, the MTJ elements 11, 21 are laid out in series between the first connection node SN and the second connection node.

The N-MOSFET 34 for power gating has the source connected to the control line SL, and has the gate connected to the bit select line BS. The N-MOSFET 34 has the drain connected to the respective ground terminals of the CMOS inverter 16 and the CMOS inverter 17.

Hence, with the signal being input from the control line SL, when the control signal is input from the bit select line BS, the N-MOSFET 34 turns ON, and 0 V is supplied to the respective ground terminals of the CMOSs 16, 17 from the control line SL.

Figure 19B:
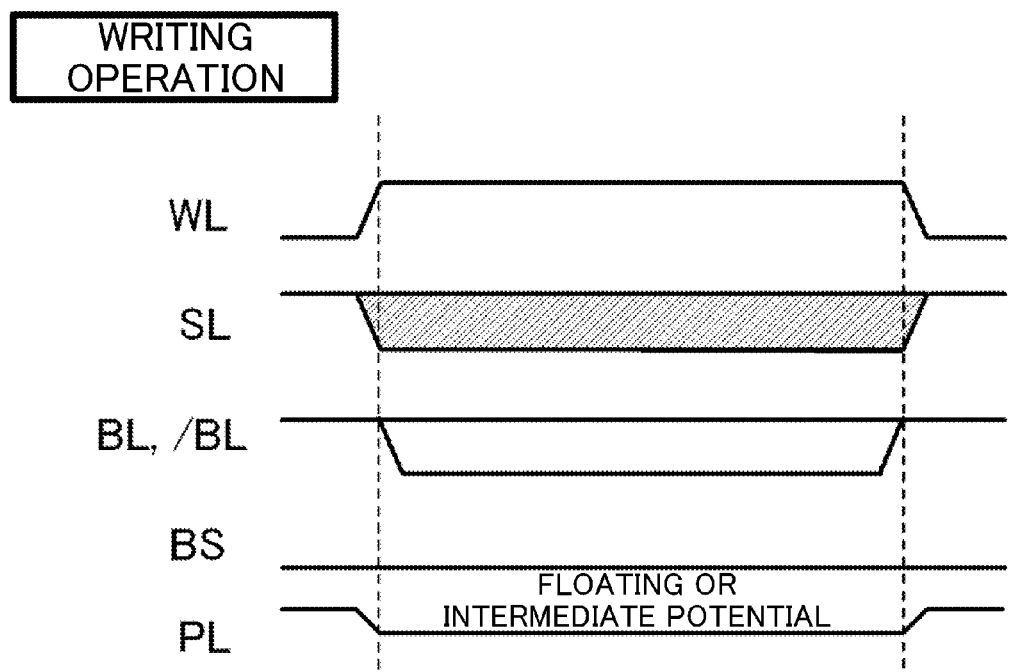
FIG. 19B is a diagram illustrating a signal waveform of each component in a writing operation.

Next, an explanation will be given of a writing operation of the memory cell 115. FIG. 19B illustrates a signal waveform supplied from each signal line at the time of writing to the memory cell 115.

At the time of writing, the high-level signal is input from the word line WL. Hence, the N-MOSFET 13, and the N-MOSFET 23 become the ON state. At this time, since the bit select line BS is set to be the low level, the N-MOSFET 34 turns OFF. Accordingly, no matter what signal is input from the control line SL, the memory cell 115 is not affected by such a signal input.

In addition, the bit line BL and the inverse bit line/BL are set to be the high level or the low level, and the power line PL is set to be an intermediate potential (or a floating state). In this case, assuming that the bit line BL is the high level, the current from the bit line BL flows, through the N-MOSFET 13, from the free layer 11c of the MTJ element 11 to the pin layer 11a. The current that has passed through the MTJ element 11 flows from the pin layer 21a of the MTJ element 21 to the free layer 21c through the power line PL, and flows to the bit line/BL through the N-MOSFET 23.

As explained above, since the current flows from the free layer 11c of the MTJ element 11 to the pin layer 11a, when the MTJ element 11 is in the high resistance state $R_{AP}$, the MTJ element 11 transitions to the low resistance state $R_P$.

In addition, as for the MTJ element 21, since the current flows from the pin layer 11a to the free layer 11c, when the MTJ element 21 is in the low resistance state $R_P$, the MTJ element 21 transitions to the high resistance state $R_{AP}$.

According to this embodiment, also, since the MTJ elements 11, 21 are laid out in series so as to have different directions of the pin layer 11a and the free layer 11c relative to the current path, the MTJ elements 11, 21 can be rewritten simultaneously.

Figure 19C:
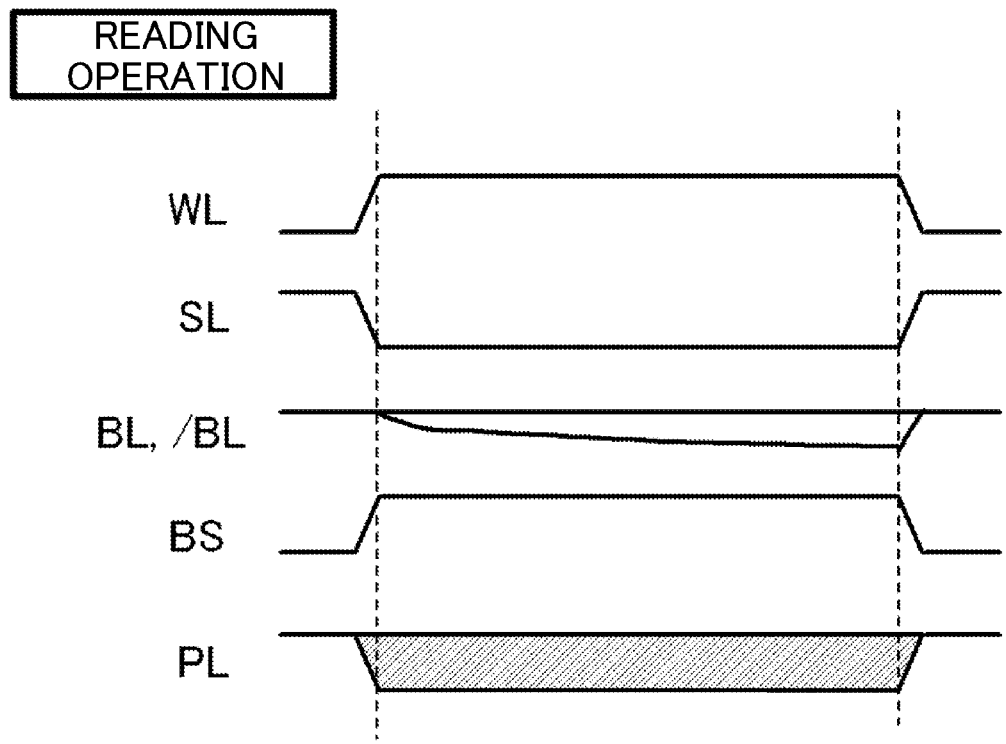
FIG. 19C is a diagram illustrating a signal waveform of each component in a reading operation.

In addition, at the time of reading, the memory cell 115 operates as follow. FIG. 19C illustrates a signal waveform on each signal line when data is read from the memory cell 115.

At the time of reading, since the word line WL is set to be the high level, the N-MOSFET 13, and the N-MOSFET 23 become the ON state. Hence, the first connection node SN and the second connection node/SN are set to be either the high level or the low level relative to each other in accordance with the respective resistance values of the MTJ elements 11, 21.

In addition, substantially simultaneous with the word line WL becoming the high level, the bit select line BS is set to be the high level, and the control line SL is set to be the low level. Hence, the N-MOSFET 34 becomes the ON state. Accordingly, the CMOS inverters 16, 17 are turned ON, and the potential difference between the first connection node SN and the second connection node/SN is amplified.

Subsequently, the amplified potential difference is transmitted to the bit line BL and the inverse bit line/BL, and is amplified by the sensing amplifier. Hence, data stored in the memory cell 115 is read. The above operation is the operation of the memory cell 115 in the 15th embodiment.

(16th Embodiment)

Figure 20A:
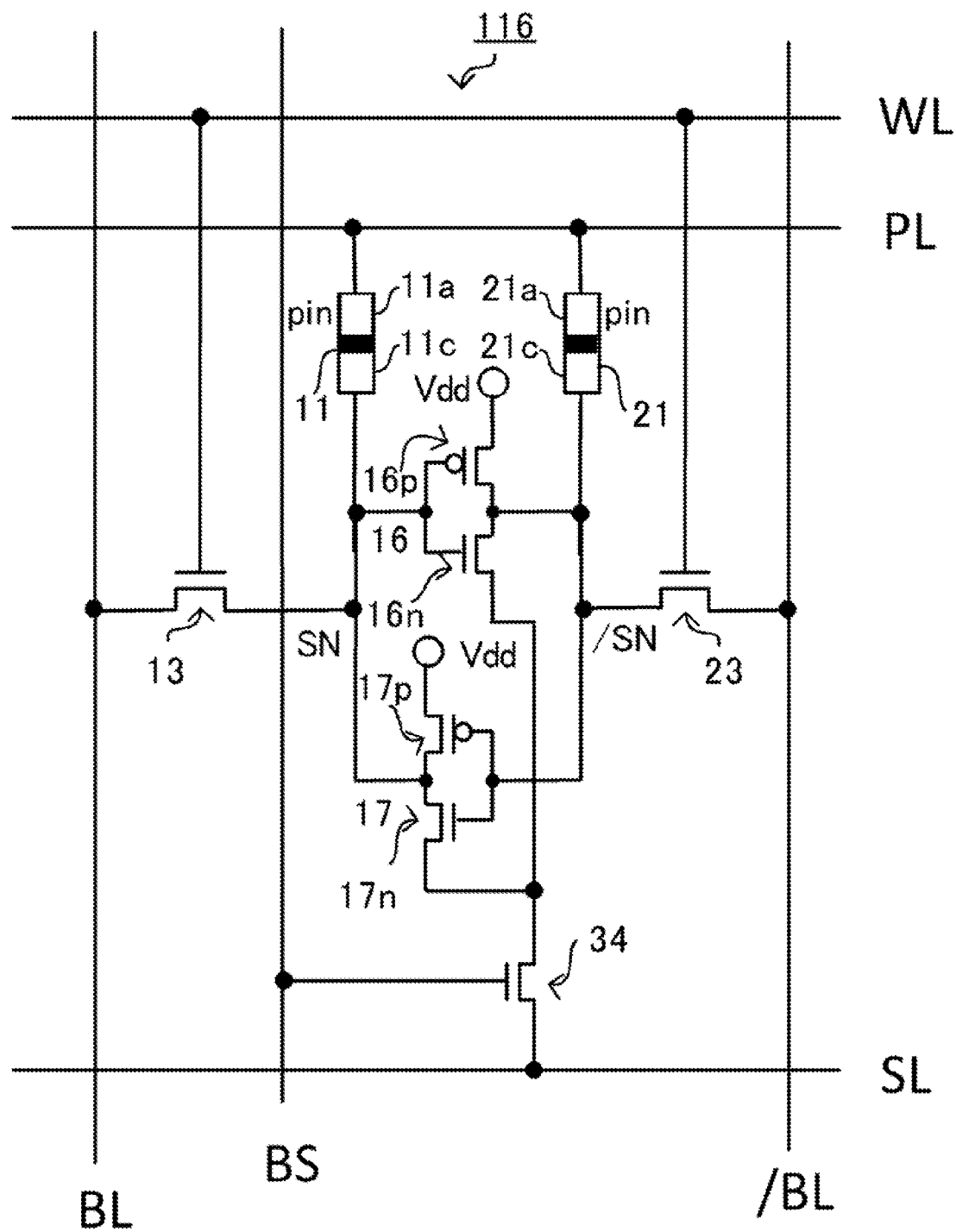
FIG. 20A is a diagram illustrating a circuit structure of a memory cell according to a 16th embodiment.
Figure 20B:
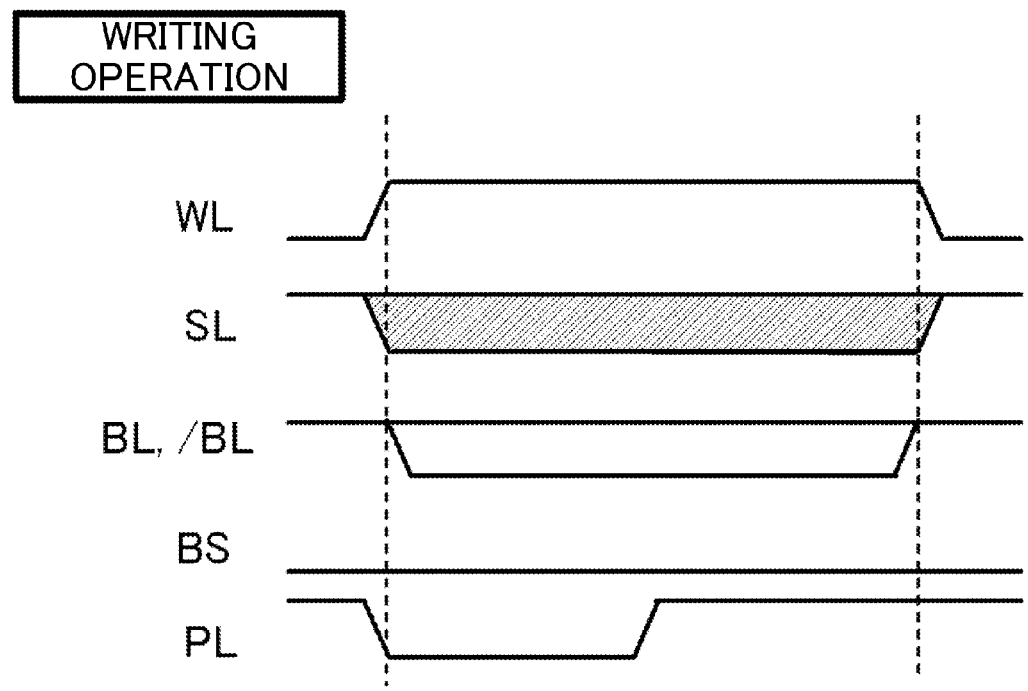
FIG. 20B is a diagram illustrating a signal waveform of each component in a writing operation.
Figure 20C:
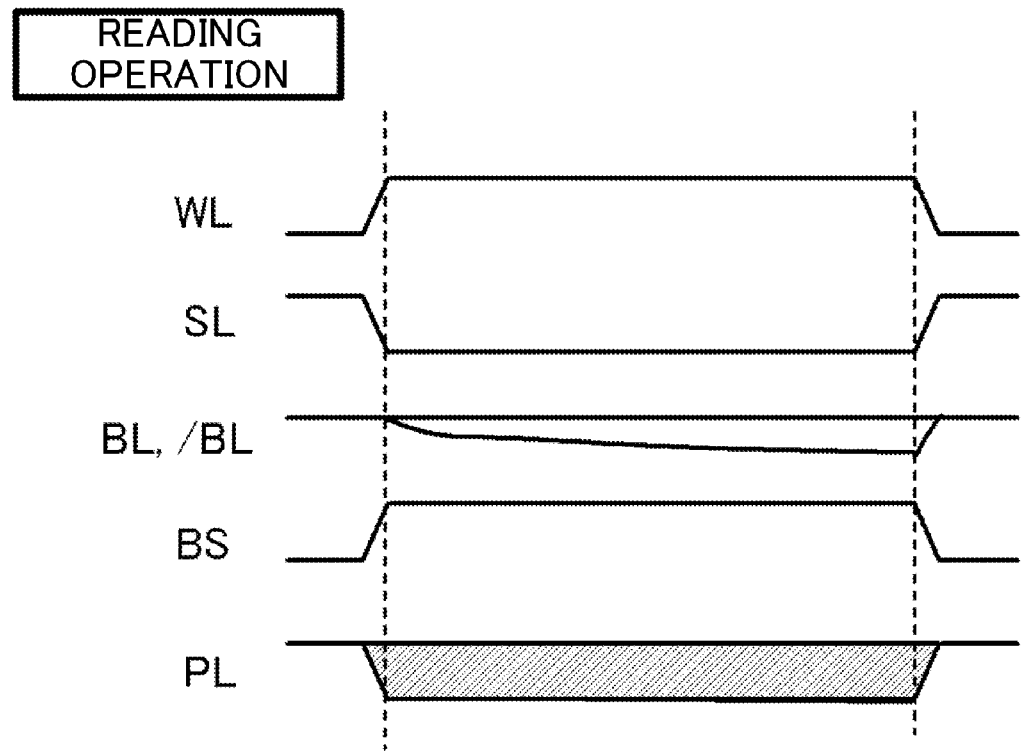
FIG. 20C is a diagram illustrating a signal waveform of each component in a reading operation.

Next, an explanation will be given of a memory cell 116 according to a 16th embodiment. FIG. 20A illustrates the circuit structure of the memory cell 116 according to the 16th embodiment. The memory cell 116 employs the same circuit structure as that of the memory cell 115 in the 15th embodiment.

In the 16th embodiment, when writing is performed on the MTJ elements 11, 21, the potential at the power line PL is set to be the low level at the first half cycle, and is set to be the high level at the second half cycle, and thus the resistance states of the two MTJ elements 11, 21 are changed separately. In addition, the reading method is the same as that of the 15th embodiment.

According to the memory cells of the embodiments of the present disclosure explained above, power gating is enabled bit by bit. In addition, the element for power gating is simply one or two MOSFETs, and thus the cell size is small in comparison with a case in which an AND gate is utilized.

Note that the present disclosure is not limited to the foregoing embodiments. The structure of the memory element can be changed as needed. In addition, power gating is performed in the unit of a memory cell, but power gating may be performed in the unit of relatively small number of, for example, four or eight memory cells. In this case, for example, the bit select line BS or/BS may be provided for each group of four or eight memory cells, one current end of the MOSFET for power gating may be connected to the power line PL (or control line SL), and the other end may be connected to the group of four or eight memory cells.

In addition, in the foregoing embodiments, the explanation has been given of the circuit that utilizes the MOSFET, but instead of the MOSFET, a bipolar transistor may be applied. Still further, in the foregoing embodiment, the explanation has been given of the example case in which the MTJ element that is a non-volatile memory element is applied, but instead of the MTJ element, other non-volatile memory elements, such as a Phase Change Random Access Memory (PCRAM) element, and a Resistance Random Access Memory (ReRAM) element, may be applied.

Figure 21:
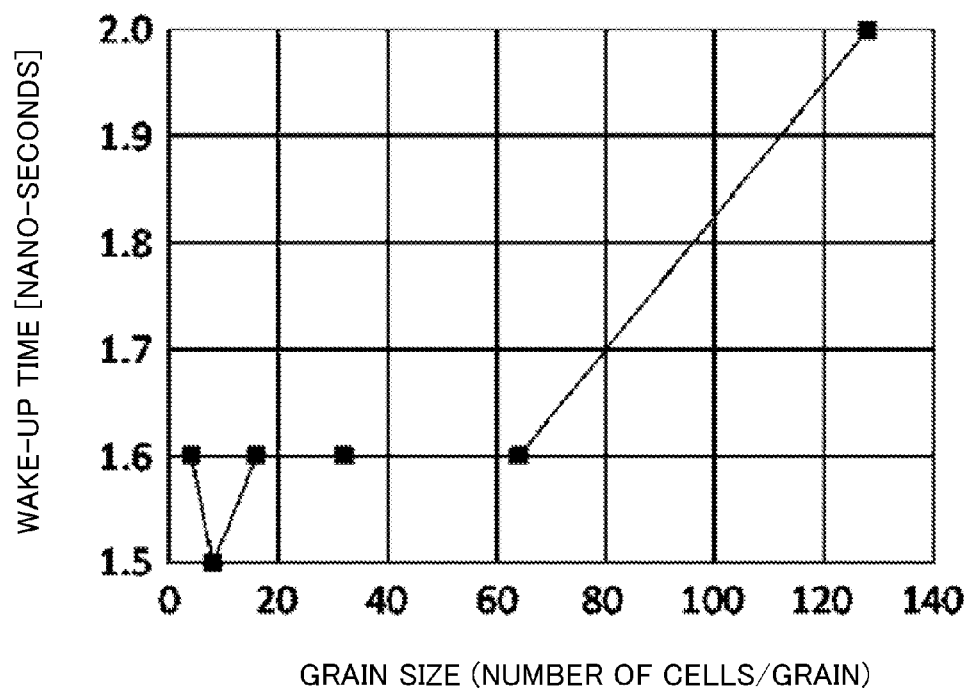
FIG. 21 is a diagram illustrating a simulation result of a grain-size dependent property of a wake-up time.
Figure 22:
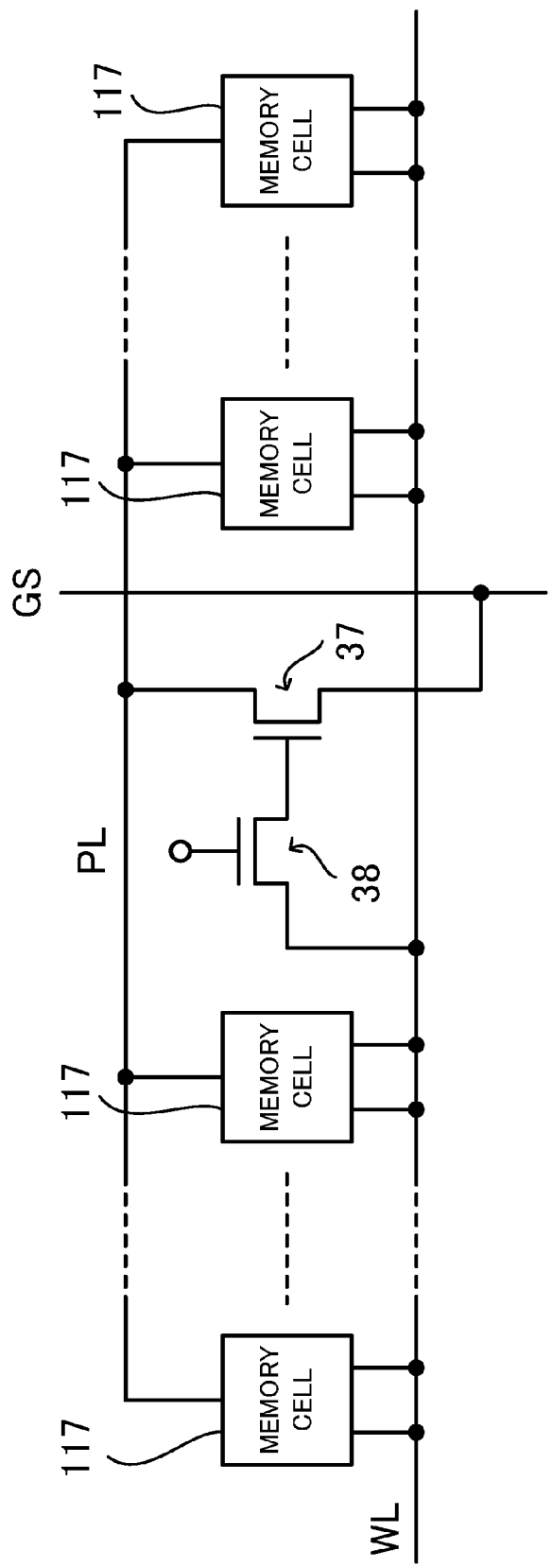
FIG. 22 is a diagram illustrating a PL driver applied for the simulation.

FIG. 21 illustrates a simulation result of a grain-size dependent property of a wake-up time (a time after the voltage of the power line PL is raised and until a potential difference of 100 mV is generated between the bit line BL and the inverse bit line/BL) when power gating is performed by two MOSFETs. As illustrated in FIG. 21, by reducing the grain size from 128 to 4, the wake-up time can be reduced from 2.0 nano-seconds to 1.5 to 1.6 nano-seconds, and thus substantially 0.5 nano-seconds can be reduced. By reducing the grain size in this manner, an effect of reducing an access time can be expected. Note that the PL driver applied in this simulation includes two MOSFETs (N-MOSFETs 37, 38) as illustrated in FIG. 22. In FIG. 22, each memory cell 117 is connected to the power line PL and the word line WL. Non Patent Literature 2 discloses further details.

Non Patent Literature 2: T. Ohsawa, S. Ikeda, T. Hanyu, H. Ohno, and T. Endoh, "A 1-Mb STT-MRAM with Zero-Array Standby Power and 1.5-ns Quick Wake-Up by 8-b Fine-Grained Power Gating", 2013 5th IEEE International Memory Workshop (IMW), Monterey, pp. 80-83, May 2013

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application is based on Japanese Patent Application No. 2013-196203 filed on Sep. 20, 2013. The entire specification, claims, and drawings of such an application are herein incorporated in this specification by reference.

INDUSTRIAL APPLICABILITY

The present disclosure is applicable to a memory cell that utilizes a magnetic tunnel junction element.

REFERENCE SIGNS LIST 10, 20 Inverter
11, 21 MTJ element
11a, 21a Pin layer
11b, 21b Insulation layer
11c, 21c Free layer
11d, 11e Electrode
12, 13, 22, 23, 32, 33, 34, 37, 38 N-MOSFET
14, 15, 24, 25, 31, 35, 36 P-MOSFET
16, 17 CMOS inverter
200 Row decoder
300 Column decoder
BL Bit line
/BL Inverse bit line
BS, /BS Bit select line
PL Power line
SL Control line
SN First connection node
/SN Second connection node
WL Word line

The invention claimed is:

1. A memory cell comprising:
a flip-flop comprising a first inverter and a second inverter, the first inverter comprising a first magnetic tunneling junction element and a first field-effect transistor, the second inverter comprising a second magnetic tunneling junction element and a second field-effect transistor, the first inverter and the second inverter being cross coupled to each other;
a power gating field-effect transistor;
a third field-effect transistor; and
a fourth field-effect transistor,
wherein:
respective pin layers of the first magnetic tunneling junction element and the second magnetic tunneling junction element are connected to a power supply line through the power gating field-effect transistor;
a control terminal of the power gating field-effect transistor is connected to a bit select line;
an output terminal of the first inverter is a node to which a free layer of the first magnetic tunneling junction element and a control terminal of the second field-effect transistor are connected, is grounded through the first field-effect transistor, and is connected to a bit line through the third field-effect transistor;
an output terminal of the second inverter is a node to which a free layer of the second magnetic tunneling junction element and a control terminal of the first field-effect transistor are connected, is grounded through the second field-effect transistor, and is connected to an inverse bit line through the fourth field-effect transistor; and
respective control terminals of the third field-effect transistor and the fourth field-effect transistor are connected to a word line.

2. The memory cell according to claim 1, wherein, at a time of data writing to the flip-flop, the power gating field-effect transistor is controlled to be an OFF state, and the third field-effect transistor and the fourth field-effect transistor are controlled to be an ON state.

3. The memory cell according to claim 1, wherein the power supply line is designed as a common line with the word line.

4. The memory cell according to claim 1, wherein:
the control terminal of the power gating field-effect transistor is connected to the bit select line through a same conductivity-type control field-effect transistor; and
a predetermined voltage is applied to a control terminal of the control field-effect transistor.

5. A storage device comprising the memory cells according to claim 1,
wherein:
the memory cells are laid out in a matrix;
a memory cell of the memory cells laid out in the matrix is connected to a word line, a bit line orthogonal to the word line, an inverse bit line orthogonal to the word line, a power supply line in parallel with the word line, and a bit select line orthogonal to the power supply line;
the word line is connected to a plurality of the memory cells in a same row;
the bit line and the inverse bit line are connected to a plurality of the memory cells in a same column;
the power supply line is connected to one end of a current path of a power gating field-effect transistor included in each of the plurality of the memory cells in the same row; and
the bit select line is connected to, directly or through a control field-effect transistor, a control terminal of the power gating field-effect transistor included in each of the plurality of the memory cells in the same column.

6. The storage device according to claim 5, wherein the power supply line is designed as a common line with the word line.

7. A memory cell comprising:
a flip-flop comprising a first inverter and a second inverter, the first inverter comprising a first magnetic tunneling junction element and a first field-effect transistor, the second inverter comprising a second magnetic tunneling junction element and a second field-effect transistor, the first inverter and the second inverter being cross coupled to each other;
a power gating field-effect transistor;
a third field-effect transistor; and
a fourth field-effect transistor,
wherein:
respective free layers of the first magnetic tunneling junction element and the second magnetic tunneling junction element are connected to a control line through the power gating field-effect transistor;
a control terminal of the power gating field-effect transistor is connected to a bit select line;
an output terminal of the first inverter is a node to which a pin layer of the first magnetic tunneling junction element and a control terminal of the second field-effect transistor are connected, is connected to a power supply terminal through the first field-effect transistor, and is connected to a bit line through the third field-effect transistor;
an output terminal of the second inverter is a node to which a pin layer of the second magnetic tunneling junction element and a control terminal of the first field-effect transistor are connected, is connected to the power supply terminal through the second field-effect transistor, and is connected to an inverse bit line through the fourth field-effect transistor; and respective control terminals of the third field-effect transistor and the fourth field-effect transistor are connected to a word line.

8. The memory cell according to claim 7, wherein, at a time of data writing to the flip-flop, the power gating field-effect transistor is controlled to be an OFF state, and the third field-effect transistor and the fourth field-effect transistor are controlled to be an ON state.

9. The memory cell according to claim 7, wherein the control line is designed as a common line with the word line.

10. The memory cell according to claim 7, wherein:
the control terminal of the power gating field-effect transistor is connected to the bit select line through a same conductivity-type control field-effect transistor; and
a predetermined voltage is applied to a control terminal of the control field-effect transistor.

11. A storage device comprising the memory cells according to claim 7,
wherein:
the memory cells are laid out in a matrix;
a memory cell of the memory cells laid out in the matrix is connected to a word line, a bit line orthogonal to the word line, an inverse bit line orthogonal to the word line, a control line in parallel with the word line, and a bit select line orthogonal to the control line;
the word line is connected to a plurality of the memory cells in a same row;
the bit line and the inverse bit line are connected to a plurality of the memory cells in a same column;
the control line is connected to one end of a current path of a power gating field-effect transistor included in each of the plurality of the memory cells in the same row; and
the bit select line is connected to, directly or through a control field-effect transistor, a control terminal of the power gating field-effect transistor included in each of the plurality of the memory cells in the same column.

12. The storage device according to claim 11, wherein the control line is designed as a common line with the word line.

13. A memory cell comprising:
a flip-flop comprising a first CMOS inverter, a second CMOS inverter, a first magnetic tunneling junction element and a second magnetic tunneling junction element, the first CMOS inverter comprising a first P-type field-effect transistor and a first N-type field-effect transistor, the second CMOS inverter comprising a second P-type field-effect transistor and a second N-type field-effect transistor;
a power gating field-effect transistor;
a third field-effect transistor; and
a fourth field-effect transistor,
wherein:
respective source terminals of the first P-type field-effect transistor and the second P-type field-effect transistor are connected to a power supply line through the power gating field-effect transistor;
a control terminal of the power gating field-effect transistor is connected to a bit select line;
an output terminal of the first CMOS inverter is a node to which respective control terminals of the second P-type field-effect transistor and the second N-type field-effect transistor are connected, is connected to an inverse bit line through the fourth field-effect transistor, and is connected to a control line through the second magnetic tunneling junction element;
an output terminal of the second CMOS inverter is a node to which respective control terminals of the first P-type field-effect transistor and the first N-type field-effect transistor are connected, is connected to a bit line through the third field-effect transistor, and is connected to the control line through the first magnetic tunneling junction element;
respective free layers of the first magnetic tunneling junction element and the second magnetic tunneling junction element are connected to the control line, and
respective control terminals of the third field-effect transistor and the fourth field-effect transistor are connected to a word line.

14. The memory cell according to claim 13, wherein, at a time of data writing to the flip-flop, the power gating field-effect transistor is controlled to be an OFF state, and the third field-effect transistor and the fourth field-effect transistor are controlled to be an ON state.

15. The memory cell according to claim 13, wherein the power supply line is designed as a common line with the word line.

16. A memory cell comprising:
a flip-flop comprising a first CMOS inverter, a second CMOS inverter, a first magnetic tunneling junction element and a second magnetic tunneling junction element, the first CMOS inverter comprising a first P-type field-effect transistor and a first N-type field-effect transistor, the second CMOS inverter comprising a second P-type field-effect transistor and a second N-type field-effect transistor;
a power gating field-effect transistor;
a third field-effect transistor; and
a fourth field-effect transistor,
wherein:
respective source terminals of the first N-type field-effect transistor and the second N-type field-effect transistor are connected to a control line through the power gating field-effect transistor;
a control terminal of the power gating field-effect transistor is connected to a bit select line;
an output terminal of the first CMOS inverter is a node to which respective control terminals of the second P-type field-effect transistor and the second N-type field-effect transistor are connected, is connected to an inverse bit line through the fourth field-effect transistor, and is connected to a power supply line through the second magnetic tunneling junction element;
an output terminal of the second CMOS inverter is a node to which respective control terminals of the first P-type field-effect transistor and the first N-type field-effect transistor are connected, is connected to a bit line through the third field-effect transistor, and is connected to the power supply line through the first magnetic tunneling junction element;
respective pin layers of the first magnetic tunneling junction element and the second magnetic tunneling junction element are connected to the power supply line, and
respective control terminals of the third field-effect transistor and the fourth field-effect transistor are connected to a word line.

17. The memory cell according to claim 16, wherein, at a time of data writing to the flip-flop, the power gating field-effect transistor is controlled to be an OFF state, and the third field-effect transistor and the fourth field-effect transistor are controlled to be an ON state.

18. A memory cell connected to a power supply line that is a common line with a word line, the memory cell comprising:

a flip-flop storing data based on a change in resistance value of a magnetic tunneling junction element; and a power gating field-effect transistor including a current path which has one end connected to the power supply line, and which has another end connected to the flip-flop, ON and OFF states of the power gating field-effect transistor being controlled based on a control signal applied to a control terminal of the power gating field-effect transistor.

19. A memory cell connected to a power supply line, the memory cell comprising:

a flip-flop storing data based on a change in resistance value of a magnetic tunneling junction element; and a power gating field-effect transistor including a current path which has one end connected to the power supply line, and which has another end connected to the flip-flop, ON and OFF states of the power gating field-effect transistor being controlled based on a control signal applied to a control terminal of the power gating field-effect transistor, wherein: the control terminal of the power gating field-effect transistor is connected to one end of a control field-effect transistor having same conductivity-type with that of the power gating field-effect transistor; and another end of the same conductivity-type control field-effect transistor is connected a bit select line; and a predetermined voltage is applied to a control terminal of the control field-effect transistor.

20. A memory cell comprising:

a flip-flop storing data based on a change in resistance value of a non-volatile memory element; and a power gating field-effect transistor including a current path which has one end connected to the word line, and which has another end connected to the flip-flop, ON and OFF states of the power gating field-effect transistor being controlled based on a control signal applied to a control terminal of the power gating field-effect transistor, whereby the flip-flop is powered by the word line through the current path of the power gating field-effect transistor.

21. A memory cell connected to a power supply line, the memory cell comprising:

a flip-flop storing data based on a change in resistance value of a non-volatile memory element; and a power gating field-effect transistor including a current path which has one end connected to the power supply line, and which has another end connected to the flip-flop, ON and OFF states of the power gating field-effect transistor being controlled based on a control signal applied to a control terminal of the power gating field-effect transistor, wherein: the control terminal of the power gating field-effect transistor is connected to one end of a control field-effect transistor having same conductivity-type with that of the power gating field-effect transistor; and another end of the same conductivity-type control field-effect transistor is connected a bit select line; and a predetermined voltage is applied to a control terminal of the control field-effect transistor.

* * * * *